(12) United States Patent
Stadelmeier et al.

(10) Patent No.: US 10,250,358 B2
(45) Date of Patent: Apr. 2, 2019

(54) TRANSMITTER AND RECEIVER FOR TRANSMITTING BASIC CODEWORD PORTION AND AUXILIARY CODEWORD PORTION OF A CODEWORD IN DIFFERENT FRAMES

(71) Applicant: SATURN LICENSING LLC, New York, NY (US)

(72) Inventors: Lothar Stadelmeier, Stuttgart (DE); Nabil Loghin, Stuttgart (DE); Joerg Robert, Vreden (DE)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 15/250,489

(22) Filed: Aug. 29, 2016

(65) Prior Publication Data

US 2016/0365946 A1   Dec. 15, 2016

Related U.S. Application Data

(63) Continuation of application No. 13/509,131, filed as application No. PCT/EP2010/065641 on Oct. 18, 2010, now Pat. No. 9,444,582.

(30) Foreign Application Priority Data

Nov. 17, 2009   (EP) .................................... 09176176

(51) Int. Cl.
*H04L 1/00*   (2006.01)
*H04L 1/18*   (2006.01)
(Continued)

(52) U.S. Cl.
CPC ............ *H04L 1/0041* (2013.01); *H04L 1/008* (2013.01); *H04L 1/0057* (2013.01);
(Continued)

(58) Field of Classification Search
CPC ... H04L 1/0041; H04L 1/0045; H04L 1/0052; H04L 1/0053; H04L 1/0057;
(Continued)

(56) References Cited

U.S. PATENT DOCUMENTS 7,751,324 B2   7/2010   Vadakital et al.
8,009,685 B2   8/2011   Himmanen et al.
(Continued)

FOREIGN PATENT DOCUMENTS

CN   1625256 A   6/2005
CN   101557509 A   10/2009
(Continued)

OTHER PUBLICATIONS

Duman, T.M., et al., "Coding for MIMO Communication Systems," John Wiley and Sons, p. 163-167, XP 002621914, (Sep. 1, 2007).
(Continued)

*Primary Examiner* — Christian M Dorman
(74) *Attorney, Agent, or Firm* — Oblon, McClelland, Maier & Neustadt, L.L.P.

(57) ABSTRACT

A transmitter and transmission method for broadcasting data. To enable a receiver, such as a moving receiver, to improve decoding quality, if needed, a transmitter includes: a data input receiving at least one transmitter input data stream segmented into input data words; an encoder error correction code encoding the input data words into codewords including a basic codeword portion and an auxiliary codeword portion, the encoder generating the basic codeword portion from an input data word according to a first code and generating the auxiliary codeword portion from an input data word according to a second code, the basic codeword portion for regular decoding and the auxiliary codeword portion for incremental redundancy if regular decoding of the codeword by using the basic codeword
(Continued)

portion is erroneous; a data mapper mapping the codewords onto frames of a transmitter output data stream; and a transmitter transmitting the transmitter output data stream.

8 Claims, 11 Drawing Sheets

(51) Int. Cl.
    *H03M 13/29*         (2006.01)
    *H03M 13/00*         (2006.01)

(52) U.S. Cl.
    CPC .......... *H04L 1/0058* (2013.01); *H04L 1/0071* (2013.01); *H03M 13/2906* (2013.01); *H03M 13/6552* (2013.01); *H04L 1/0045* (2013.01); *H04L 1/0052* (2013.01); *H04L 1/0053* (2013.01); *H04L 1/0061* (2013.01); *H04L 1/0072* (2013.01); *H04L 1/0078* (2013.01); *H04L 1/0083* (2013.01); *H04L 1/18* (2013.01); *H04L 2001/0093* (2013.01)

(58) Field of Classification Search
    CPC ... H04L 1/0061; H04L 1/0071; H04L 1/0072; H04L 1/0078; H04L 1/008; H04L 1/0083; H04L 1/18; H03M 13/1102; H03M 13/1105; H03M 13/1165; H03M 13/152; H03M 13/29; H03M 13/2948; H03M 13/3761; H03M 13/618; H03M 13/63; H03M 13/6306; H03M 13/6541; H03M 13/6552
    See application file for complete search history.

(56) References Cited

U.S. PATENT DOCUMENTS

| | | |
|---|---|---|
| 2005/0052991 A1 | 3/2005 | Kadous |
| 2005/0193312 A1* | 9/2005 | Smith ............... H03M 13/3707 714/755 |
| 2005/0276259 A1 | 12/2005 | Nakabayashi et al. |
| 2006/0109805 A1* | 5/2006 | Malamal Vadakital ..................... H04L 29/06027 370/299 |
| 2006/0133533 A1 | 6/2006 | Khandekar et al. |
| 2007/0191024 A1* | 8/2007 | Kim ..................... H04L 1/0003 455/456.2 |
| 2008/0192849 A1 | 8/2008 | Kim et al. |
| 2009/0067424 A1 | 3/2009 | Zhang et al. |
| 2009/0175210 A1 | 7/2009 | Vijayan et al. |
| 2009/0196217 A1 | 8/2009 | Himmanen et al. |
| 2010/0086087 A1 | 4/2010 | Pekonen et al. |
| 2010/0223524 A1 | 9/2010 | Duggan et al. |

FOREIGN PATENT DOCUMENTS

| | | |
|---|---|---|
| EP | 1 521 384 | 4/2005 |
| EP | 2 028 785 A2 | 2/2009 |
| WO | 2005/020499 A1 | 3/2005 |
| WO | 2008/069492 A1 | 6/2008 |
| WO | 2009 018180 | 2/2009 |

OTHER PUBLICATIONS

Yuan, J., et al., "Performance of Parallel and Serial Concatenated Codes on Fading Channels," IEEE Transactions on Communications, vol. 50, No. 10, pp. 1600-1608, (Oct. 1, 2002).
Kim, J., et al., "Design of Rate-Compatible Irregular LDPC Codes for Incremental Redundancy Hybrid ARQ Systems," ISIT 2006, pp. 1139-1143, (Jul. 9-14, 2006).
ETSI EN 302 775, V1.1.1, "Digital Video Broadcasting (DVB); Frame structure channel coding and modulation for a second generation digital terrestrial television broadcasting system (DVB-T2)," Total 167 Pages, (Sep. 2009).
ETS 300 401, "Radio broadcasting systems; Digital Audio Broadcasting (DAB) to mobile, portable and fixed receivers," EBU/CENELEC/ETSI JTC, Second Edition, Total 226 Pages, (May 1997).
"Implementation guidelines for a second generation digital terrestrial televsion broadcasting system (DVB-T2)," Digital Video Broadcasting, Document A133, Total 194 Pages, (Feb. 2009).
International Search Report dated Feb. 21, 2011 in PCT/EP10/65641 Filed Oct. 18, 2010.
Office Action dated Oct. 22, 2014, in Taiwanese Patent Application No. 099136542 (with English translation).
Combined Chinese Office Action and Search Report dated Jun. 27, 2014, in Patent Appln No. 2010800522603 (submitting English translation only).
Combined Chinese Office Action and Search Report dated Jan. 8, 2018 in corresponding Patent Application No. 201510509520.X (with English Translation), 10 pages.

* cited by examiner

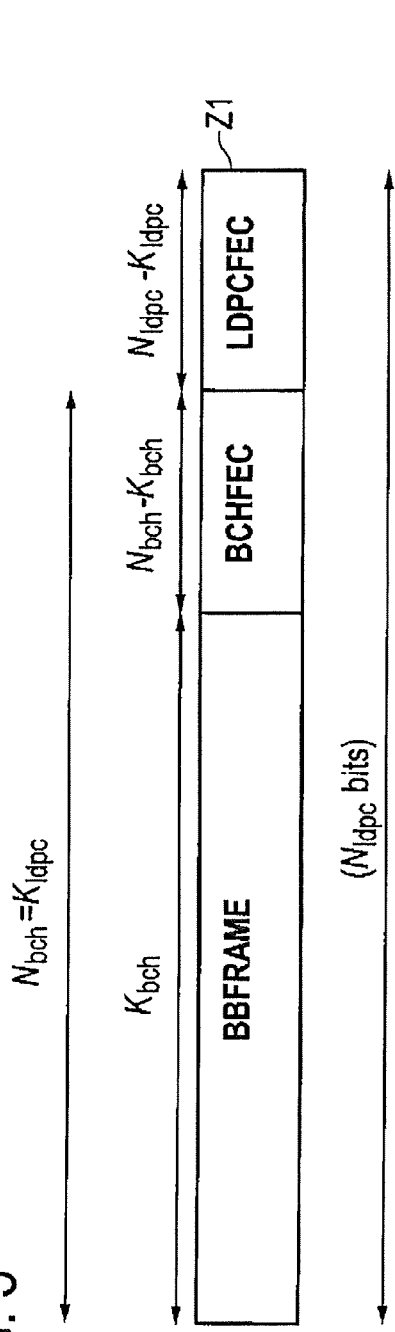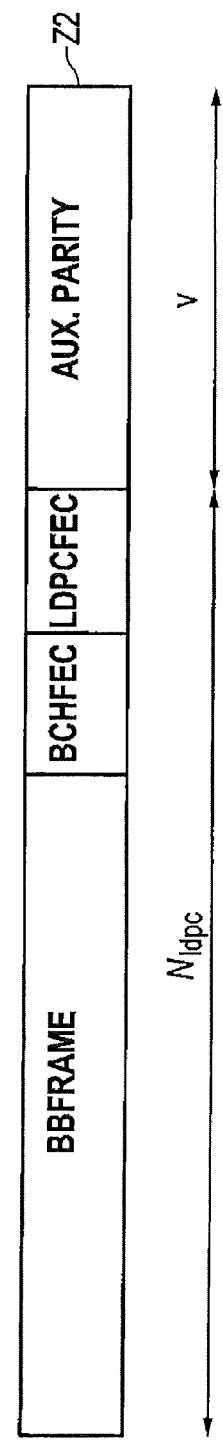
FIG. 5
FIG. 6

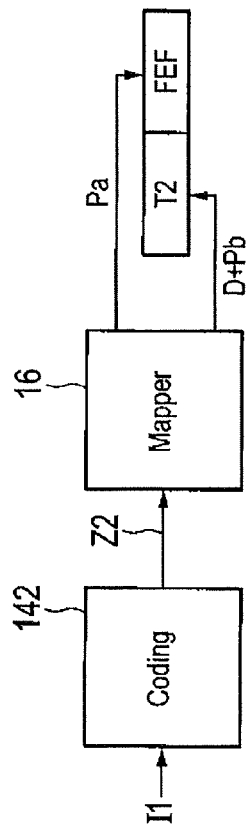
FIG. 9
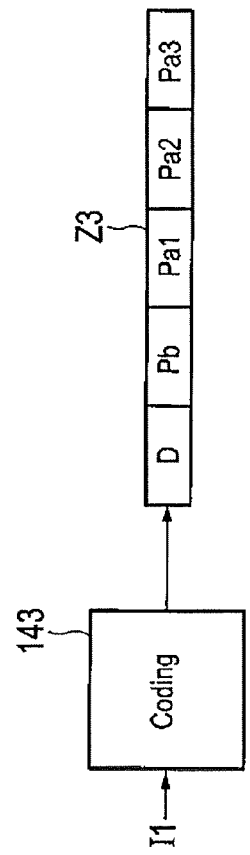
FIG. 10
FIG. 11

TRANSMITTER AND RECEIVER FOR TRANSMITTING BASIC CODEWORD PORTION AND AUXILIARY CODEWORD PORTION OF A CODEWORD IN DIFFERENT FRAMES

CROSS-REFERENCE TO RELATED APPLICATIONS

The present application is a continuation application of and claims the benefit of priority under 35 U.S.C. § 120 from U.S. application Ser. No. 13/509,131, filed Jul. 12, 2012, which is a national stage of and claims priority under 35 U.S.C. § 365, to Patent Cooperation Treaty Application No. PCT/EP2010/065641, filed on Oct. 18, 2010, which claims priority to European Patent Application No. 09176176.7, filed on Nov. 17, 2009, the entire contents of each of which is incorporated herein by reference.

FIELD OF INVENTION

The present invention relates to a transmitter and a corresponding transmission method for broadcasting data in a broadcasting system. Still further, the present invention relates to a computer program for implementing said transmission method on a computer.

The present invention relates, for instance, to the field of Digital Video Broadcasting (DVB) utilizing Orthogonal Frequency Division Multiplexing (OFDM). Further, the present invention can be applied in other systems, such as DAB (Digital Audio Broadcasting), DRM, MediaFlo, or ISDB system.

BACKGROUND OF THE INVENTION

The transmission parameters of known broadcasting systems, such as the broadcasting systems in accordance with the DVB-T2 standard (second generation digital terrestrial television broadcasting systems standard), are generally optimized for fixed reception with stationary receivers, e.g. with roof-top antennas. In future broadcasting systems, such as the upcoming DVB-NGH (DVB Next Generation Handheld; in the following also referred to as NGH) standard, a mobile receiver (which is the main focus of this upcoming standard) shall be enabled to receive data correctly also in bad reception situations, e.g. despite suffering from multi path propagation, fading effects and Doppler shifts. Such broadcasting systems are particularly characterized by the fact that there is generally no feedback channel and no signalling from receivers to transmitters.

SUMMARY OF INVENTION

It is an object of the present invention to provide a transmitter and a corresponding transmission method for broadcasting data in a broadcasting system by which the probability of error-free reception/reconstruction of data by a mobile receiver is increased compared to transmitters and transmission methods in known broadcasting systems, even under bad reception conditions. It is a further object of the present invention to provide a computer program for implementing said transmission method.

According to an aspect of the present invention there is provided a transmitter for broadcasting data in a broadcasting system, comprising:

a data input for receiving at least one transmitter input data stream segmented into input data words, an encoder for error correction code encoding the input data words into codewords, a codeword comprising a basic codeword portion and an auxiliary codeword portion, wherein said encoder is adapted for generating said basic codeword portion from an input data word according to a first code and for generating said auxiliary codeword portion from an input data word according to a second code, said basic codeword portion being provided for regular decoding and said auxiliary codeword portion being provided as incremental redundancy if regular decoding of the codeword by use of the basic codeword portion is erroneous, a data mapper for mapping the codewords onto frames of a transmitter output data stream, and a transmitter unit for transmitting said transmitter output data stream.

According to further aspects of the present invention there is provided a corresponding transmission method and a computer program comprising program means for causing a computer to carry out the steps of encoding and mapping of the transmission method as defined above, when said computer program is carried out on a computer.

Preferred embodiments of the invention are defined in the dependent claims. It shall be understood that the claimed apparatus, the claimed methods and the claimed computer program have similar and/or identical preferred embodiments as the claimed transmitter and as defined in the dependent claims.

The present invention is based on the idea to enable a mobile receiver, for instance an in-car receiver or a handheld receiver (e.g. in a mobile phone or a PDA) in a broadcasting system to decode broadcast data even under severe transmission channel conditions by improving the provided error correction measures. In particular, it is proposed to provide a sufficient amount of redundancy by the encoder to increase the robustness of the code. Said additional redundancy is provided by the transmitter such that a receiver can, but does not mandatorily, use it if reception or reconstruction (decoding) of received broadcast data is erroneous or could only be made with insufficient quality. The broadcasting operator also has the ability to choose from a variety of different coding and modulation schemes, thereby trading off throughput versus robustness.

To ensure that a receiver (e.g. an existing legacy receiver), in particular its decoder, can correctly decode received data without any additional redundancy provided according to the present invention, a first code is applied by the error correction code encoder (generally applying forward error correction) of the proposed transmitter to generate a basic codeword portion for the data words of the data to be broadcast. This way of encoding can be the known standard way of encoding input data words into codewords, for instance the forward error correction (FEC) encoding as applied in DVB-T2 transmitters (e.g. LDPC encoding), i.e. the basic codeword portion may correspond to a ("normal" error correction code) codeword according to the DVB-T2 standard (in the following also referred to as T2). In addition, however, it is proposed according to the present invention to provide incremental redundancy for the decoder of the receiver by generating an auxiliary codeword portion from the input data words according to a second code. The "total" code, i.e. the code according to which the "total" codeword (comprising the basic codeword portion and the auxiliary codeword portion) is generated, thus has a lower code rate than the first code. Hence, said "total" code, in particular said auxiliary codeword portion, provides a higher robustness and enables (better) decoding than the first code even under bad reception conditions.

Hence, under normal reception conditions the decoder does generally not (need to) use the auxiliary codeword portion at all, but only uses the basic codeword portion to decode the received data. In situations where the decoder realizes that the decoding of received data is erroneous or with insufficient quality it uses part of or the complete auxiliary codeword portion to better decode the received data. Thus, the basic codeword portion can be used as it is by a receiver/decoder for decoding, and the auxiliary codeword portion needs only to be used if really needed for decoding.

Furthermore, the auxiliary codeword portion represents an additional measure for improving the decoding abilities, particularly for mobile receivers in case of bad reception conditions. Both the basic codeword portion as well the auxiliary codeword portion are mapped into the transmitter output data stream by an appropriate data mapper of the transmitter, said transmitter output data stream generally being segmented into frames. For instance, a framing structure as applied according to the DVB-T2 system using T2 frames and FEF (Future Extension Frames) frames can be used for transporting the two codeword portions in an appropriate way.

Preferably, the encoder and the decoder apply a systematic code for generating said codewords such that said basic codeword portion comprises a data portion, in particular the input data word, and a basic parity portion, and said auxiliary codeword portions comprises an auxiliary parity portion. For instance, the basic codeword portion may be a combination of information symbols (e.g. information bits or information bytes) of an input data word and generated basic parity symbols (e.g. basic parity bits or bytes), said combination representing a basic codeword of a first code, which can be decoded by the decoder. In this example, the auxiliary codeword portion may comprise auxiliary parity symbols (e.g. auxiliary parity bits or bytes), said auxiliary codeword portion representing an auxiliary codeword of a second code, which can be used, to improve the likelihood of decoding said first codeword.

According to a preferred embodiment the data mapper is adapted for mapping the basic codeword portion of a codeword onto a different portion of the transmitter output data stream, in particular onto a different frame, than the auxiliary codeword portion of the same codeword. This provides the advantage that the auxiliary codeword portion might not be affected by disturbances of the channel that affect the basic codeword portion, such as time selective fadings or noise bursts. Generally, the amplitude and phase of different reception paths also depend on the position of the receiver. Further, in case of a moving receiver, especially the phase of the signals of different reception paths changes, which causes a time-selective channel. The changes in the time direction can also have a very regular structure, the change rate of which over the time axis being proportional to the relative velocity of the receiver to the transmitter and the transmission frequency of a signal. Also other disturbances, such as impulsive noise, can have a regular structure, e.g. caused by the line cycle frequency of the power grid or by bursts from other data transmission systems, e.g. a GSM communications system. Mapping the basic codeword portion on the one hand and the corresponding auxiliary codeword portion on the other hand onto different portions of the transmitter output data stream may in such situations avoid that all data related to a particular codeword are affected by such regular disturbances and may thus ensure correct decoding of the codeword at the receiver. Further, as will be explained below in more detail, a receiver can fall into sleeping mode during the transmission of the auxiliary data portion, if said auxiliary data portion is not required for decoding.

According to another preferred embodiment said data mapper is adapted for mapping the basic codeword portion of a codeword onto a frame of a first type of the transmitter output data stream, in particular onto a T2 frame of a transmitter output data stream in accordance with a DVB broadcasting system, and for mapping the auxiliary codeword portion of the respective codeword onto a frame of a second type, arranged between frames of the first type, of the transmitter output data stream, in particular onto an FEF frame of a transmitter output data stream in accordance with a DVB broadcasting system. This provides the advantage that stationary receivers only access the data transmitted in the frames of the first type, for instance that receivers in accordance with the DVB-T2 standard only access the data transmitted in the T2 frames. Mobile receivers generally also access the data transmitted in the frames of the first type which are also, according to the present invention, sufficient for correctly decoding the received codewords and for reproducing the encoded data words. However, if the decoder realizes that the decoding is erroneous or that the decoded data have insufficient quality, it may then also access the data, i.e. the auxiliary codeword portion, transmitted in the frames of a second type and use these additional data as incremental redundancy, i.e. use the basic codeword portion and (part or all of) the auxiliary codeword portion for decoding, which finally provides an increased probability that the data are decoded correctly since the total code of a codeword, i.e. a combination of the basic codeword portion and the auxiliary codeword portion, has lower code rate than the first code according to which the first codeword is encoded.

This embodiment provides the additional advantage that the existing framing structure as defined in the DVB-T2 standard may be used, for instance in such a way that stationary receivers (in accordance with the DVB-T2 standard) only access the data transmitted in the T2 frames and that mobile receivers access the data transmitted in the T2 frames and, if needed, in addition the auxiliary codeword portions transmitted in the FEF frames. Stationary receivers may, of course, also make use of the auxiliary codeword portions transmitted in the FEF frames if needed, but will generally ignore these data.

In a preferred embodiment the encoder comprises a first encoding unit for encoding, according to said first code, the input data word into a basic codeword including said basic codeword portion and a second encoding unit for encoding, according to said second code, the input data word into an auxiliary codeword including said auxiliary codeword portion. Further, the data mapper is adapted for mapping the basic codeword onto a different portion of the transmitter output data stream, in particular onto a different frame, than the auxiliary codeword. Hence, according to this embodiment, an already existing encoder, i.e. the first encoding unit, can be used without any changes, and simply a second encoder, i.e. the second encoding unit, is added which is also provided with the input data words from which the auxiliary codewords are generated according to the second code, which itself may also have a lower code rate than the first code applied by the first encoding unit, but which can also have the same or a higher code rate.

While it is generally possible to map both the basic codewords and the auxiliary codewords completely onto the transmitter output data stream, it is in certain embodiments (in particular if the auxiliary codewords do not only contain auxiliary parities but also parts of or the complete input data word and/or basic parities of the basic codeword) sufficient for achieving the desired object that only the auxiliary parity portion is mapped onto the transmitter output data stream in addition to the basic codeword. The receiver then exploits, in case of need, the auxiliary parity portion as redundancy for decoding a received basic codeword that could not be decoded correctly.

The second encoding unit may further be adapted for encoding, according to said second code, the input data word into an auxiliary codeword including said basic codeword portion and said auxiliary codeword portion. Hence, the basic codeword portion is part of both the basic codeword and the auxiliary codeword, but is not further used in the auxiliary codeword, from which basically the auxiliary parity portion is embedded into the transmitter output data stream. Such an embodiment has the advantage that the first encoding unit can be the (conventional) encoder of a known receiver, e.g. a receiver in accordance with the DVB-T2 standard, which can generally be used without changes, and to which the second encoding unit is added according to the invention.

Alternatively, the second encoding unit may further be adapted for encoding, according to said second code, the input data word into an auxiliary codeword including only said auxiliary codeword portion. Such an encoding unit can be easily added to an existing encoder and performs only the minimum required steps for implementing the present invention on the transmitter side.

According to an alternative embodiment said encoder comprises a single encoding unit for encoding the input data word into a codeword including said basic codeword portion and said auxiliary codeword portion, and wherein said data mapper is adapted for mapping the basic codeword portion of said codeword onto a different portion of the transmitter output data stream, in particular onto a different frame, than the auxiliary codeword portion of said codeword. This embodiment requires less processing capacity since only a single encoding process is carried out for generating the codewords, which are thereafter split up into the basic codeword portion, on the one hand, and the auxiliary codeword portion on the other hand.

According to a further embodiment said encoder is adapted for encoding the input data words into codewords, a codeword comprising a basic codeword portion and an auxiliary codeword portion, said auxiliary codeword portion including at least two auxiliary codeword sub-portions, said basic codeword portion being provided for regular decoding and said at least two auxiliary codeword sub-portions being provided as incremental redundancies if regular decoding of the codeword by use of the basic codeword portion and less redundancies is erroneous. This embodiment provides the advantage that a receiver may decide how many additional incremental redundancies it requires for correct decoding if the regular decoding, i.e. the decoding by use of only the basic codeword portion, is erroneous. This is enabled by encoding the input data words such that two or more auxiliary codeword sub-portions (e.g. two or more groups of auxiliary parity symbols) are generated which can stepwise be used as such incremental redundancies, i.e. the auxiliary codeword sub-portions are generated such that not all sub-portions are required completely to perform a correct decoding of a received codeword, but one or more sub-portions thereof are also sufficient for a correct decoding. If more sub-portions are used, however, the code rate decreases and the probability of correct decoding increases.

Thus, each receiver may decide by itself (which decision may also change from time to time) how many additional incremental redundancies, i.e. how many of those at least two auxiliary codeword sub-portions shall be used for increasing the quality of decoding, if needed. Hence, if only a small sub-portion is additionally required, the other auxiliary codeword sub-portions may be ignored and may not even be received or at least demapped at all so that during time when these other auxiliary codeword sub-portions are transmitted the receiver can be switched into sleeping mode saving battery power and processing time.

This embodiment may be developed further such that the data mapper is adapted for mapping the at least two auxiliary codeword sub-portions of a codeword onto said transmitter output data stream such that the auxiliary codeword sub-portion used as first incremental redundancy is received by a receiver after reception of the respective basic codeword portion, but before further auxiliary codeword sub-portions. Such an embodiment ensures that a receiver can be switched into sleeping mode after having received sufficient auxiliary codeword sub-portions for enabling a correct decoding if, as proposed, the "most helpful" auxiliary codeword sub-portions (e.g. the largest auxiliary codeword sub-portions) are transmitted first. In another embodiment, the auxiliary codeword sub-portions may be mapped on the transmitter output data stream such that at first a small auxiliary codeword sub-portion is provided, and that thereafter auxiliary codeword sub-portions are provided with increasing size.

The sequence of the auxiliary codeword sub-portions can preferably be derived by the receiver from the sequence of the related basic codeword portions transmitted before so that no additional signalling is required for signalling the sequence of the auxiliary codeword sub-portions, e.g. the sequence of the auxiliary codeword sub-portions is identical to the then already known sequence of the related basic codeword portions.

Further, if in the frames (e.g. T2 frames) preceding a frame (e.g. FEF frame) containing auxiliary codeword sub-portions data from various transmitter input data streams (e.g. PLPs) are contained, the auxiliary codeword sub-portions may be grouped together such that, for instance, the largest or smallest sub-portions of all auxiliary codeword portions are transmitted first, and that thereafter further groups of sub-portions are transmitted.

Generally, the basic codeword portions and the auxiliary codeword portions are mapped onto the transmitter output data stream such that a basic codeword portion of a codeword is received by a receiver before the corresponding auxiliary codeword portion is received. Alternatively, however, the data mapper is adapted for mapping the basic codeword portions and the auxiliary codeword portions onto frames of a transmitter output data stream such that the auxiliary codeword portion of a codeword is received by a receiver before the corresponding basic codeword portion is received. The auxiliary codeword portions are thus buffered in the receiver in a respective buffer. If it is clear that the decoding of the corresponding codeword based on only the basic codeword portion was correct, the corresponding auxiliary codeword portion (if any) can be deleted from the buffer. Even if decoding based on the basic codeword portion is not correct, the corresponding auxiliary codeword portion is already available in the buffer. This provides the advantage that no or reduced waiting times (for waiting for the auxiliary parity portion, if the decoding was erroneous based on the basic codeword portion) occur, which is particularly important for reducing zapping times and for mobile receivers in case of sudden signal distortions. Hence, this embodiment also provides the advantage that no interruption of the service occurs (due to waiting for reception of auxiliary codeword portions) in case of (e.g. sudden) bad reception conditions of the basic codeword portions.

According to another embodiment the data input is adapted for receiving at least two transmitter input data streams segmented into input data words and the encoder is adapted for selectively encoding a transmitter input data stream only according to the first code, according to the second code or according to both codes. Hence, according to this embodiment the transmitter, for instance under control of the system operator of the broadcasting system, has the freedom to apply the idea of the present invention to provide incremental redundancies into the transmitter output data stream only for selected transmitter input data streams but must not generally apply it to all transmitter input data streams. For instance, a system operator may decide to apply the present invention for data streams that are provided for reception by both a stationary receiver and a mobile receiver, while other data streams that shall generally only be received by stationary receivers are not processed according to the present invention, i.e. no auxiliary codeword portions are generated and transmitted.

Generally, the transmitter output data stream can be transmitted by any kind of transmitter, for instance having only a single antenna or multiple antennas such as, for instance, used in MIMO (Multiple Input Multiple Output) systems. In a preferred embodiment, however, the data mapper is adapted for mapping the basic codeword portions of the codewords onto a first transmitter output data stream and for mapping the auxiliary codeword portions of the codewords onto a second transmitter output data stream, and the transmitter unit comprises a MIMO precoder for MIMO precoding said first and second output data streams, and at least two antennas including a first antenna and a second antenna for transmitting said MIMO precoded first and second transmitter output data streams. For instance, the MIMO precoder is adapted for spatial multiplexing such that a first antenna transmits said first transmitter output data stream and a second antenna transmits said second transmitter output data stream. Generally, however, any other embodiment of MIMO precoding (e.g. Alamouti precoding) can also be applied on the two transmitter output data streams before outputting them by two or more antennas of a MIMO system.

A receiver may also have only a single antenna or multiple antennas, wherein generally each antenna of the receiver receives signals from all antennas of the transmitter. It may, however, also be possible that generally the antennas of the receiver are tuned to receive the signals from the first antenna only (i.e. for receiving the first transmitter output data stream) and that only in case of decoding problems or errors the antennas are additionally tuned to receive the signals from the second antenna (for receiving the second transmitter output data stream). According to a further embodiment it may be possible that the receiver comprises one antenna that is tuned to the first antenna of the transmitter and that the receiver comprises a second antenna that is tuned to receive the signals from the second antenna of the transmitter, and that the signals received at the second antenna are only evaluated in case of need.

In a further embodiment the transmitter comprises a modulator for modulating the basic codeword portion of a codeword differently than the auxiliary codeword portion of the same codeword before or after mapping the codewords onto the frames of the transmitter output data stream. In general, the auxiliary codeword portion can be transmitted in any dimension, which is orthogonal to the basic codeword portion of a codeword, such as time, frequency, space (MIMO) or spreading code. The term "orthogonal" shall be understood as generally known in the art of coding and modulation, i.e. to provide separable data streams (which might even overlap before separation, such as OFDM sub-carriers and their related partial spectra). This provides the advantage that the auxiliary codeword portion is additionally protected against disturbances by which the basic codeword portion may be disturbed. Another possibility is the application of a hierarchical modulation. In this case, the basic codeword portion addresses the more reliable bits of the modulation scheme, while the auxiliary codeword portion addresses the less reliable bits.

According to another embodiment the encoder is adapted for generating said auxiliary codeword portions such that they comprise parts of or the complete basic codeword portion. Hence, according to this embodiment the auxiliary codeword portion comprises some repetitions of data included in the basic codeword portion (e.g. the input data word and/or basic parity symbols), which can then be used as additional redundancy for decoding at the receiver. This embodiment is generally simple to implement and provides the advantage that unreliably transmitted data are repeated again as part of the auxiliary data portion.

BRIEF DESCRIPTION OF DRAWINGS

These and other aspects of the present invention will be apparent from and explained in more detail below with reference to the embodiments described hereinafter. In the following drawings FIG. 5 shows the format of an FEC codeword in accordance with a DVB-T2 standard, FIG. 6 shows the format of a codeword in accordance with the present invention, FIG. 9 shows a schematic block diagram of a second embodiment of an encoder, FIG. 10 shows a schematic block diagram of a third embodiment of an encoder, FIG. 11 illustrates the arrangement of auxiliary parity portions according to the present invention.

FIG. 1 shows an example block diagram of a transmitter 10 in accordance with the present invention. Such a transmitter 10 can, for instance, be a Coded OFDM (COFDM) transmitter which may be used to transmit video, images and audio signals in accordance with the DVB-T2 (or an upcoming DVB-NGH) standard and in which the invention can be used. Said data to be transmitted by the transmitter 10 are generally provided as at least one transmitter input data stream I1, I2, ..., In, which data streams are generally segmented into input data words. Said transmitter input data streams I1, I2, ..., In may be one or more (e.g. MPEG-2) Transport Stream(s) and/or one or more Generic Stream(s), and the data may be carried therein in individual Physical Layer Pipes PLPs.

Figure 1:
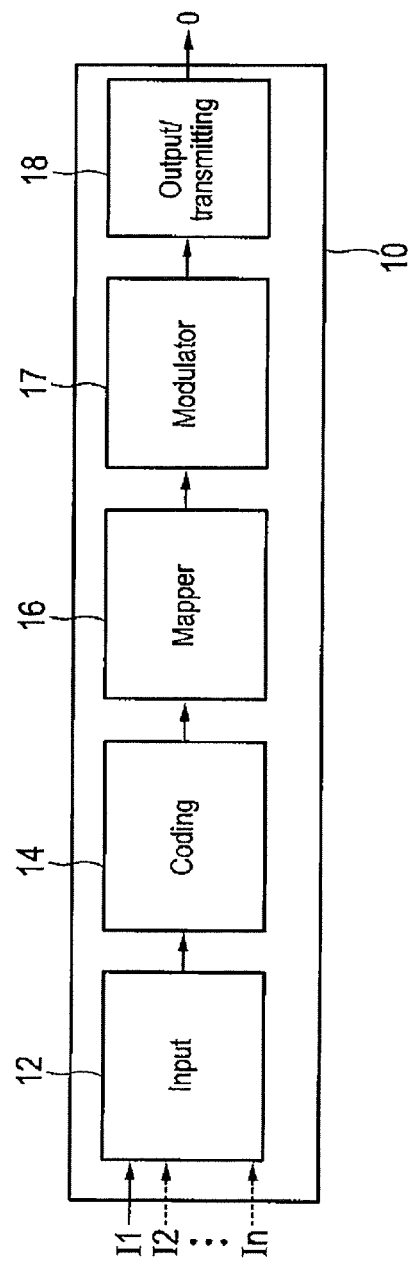
FIG. 1 shows a schematic block diagram of an embodiment of a transmitter in accordance with the present invention.

From the data input 12, in which some input processing may be performed on the transmitter input data streams I1, I2, ..., In, such as CRC (Cyclic Redundancy Check) encoding, BB (BaseBand) header insertion, padding insertion and BB scrambling, the input data are provided to an encoder 14 in which the input data words of the transmitter input data streams I1, I2, ..., In are encoded into codewords as will be explained in more detail below. From the encoder 14 the encoded data are then provided to a data mapper 16 for mapping the generated codewords onto frames of a transmitter output data stream O, which is then outputted by a transmitter unit 18. Generally (but not mandatorily), a modulator 17 is provided for modulating the data before output and transmission.

Figure 2:
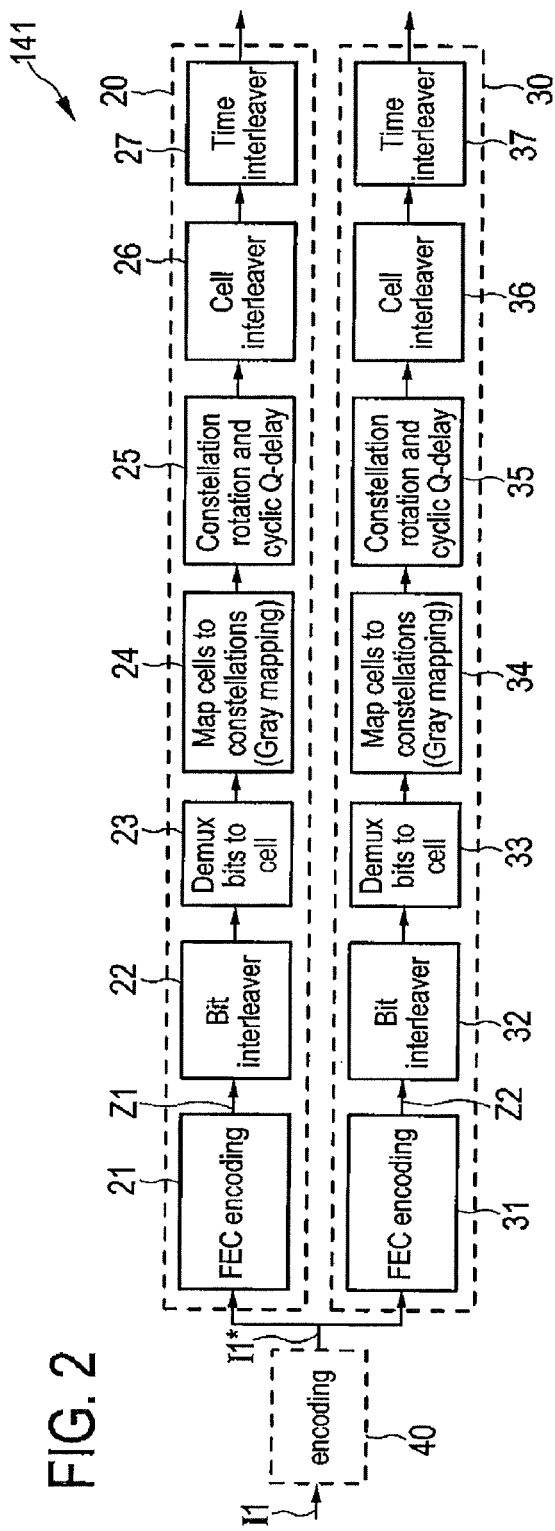
FIG. 2 shows a schematic block diagram of a first embodiment of an encoder used in the transmitter.

FIG. 2 depicts a first embodiment 141 of an encoder 14 according to the present invention. Said embodiment of the encoder 141 comprises two branches, i.e. two encoding units 20, 30 to which a transmitter input data stream I1, called Physical Layer Pipe (PLP) in context of DVB, is fed. With the exception of the time interleavers 27, 37, the processing is preferably performed on a fixed frame level. An input frame of the transmitter input data stream I1, which shall be looked at in the following as an example, is denoted as a BBFrame in the context of DVB.

The first encoding unit 20, i.e. the upper branch, in this embodiment corresponds to the Bit Interleaved Coding and Modulation (BICM) chain as described in the DVB-T2 standard (ETSI EN 302 755 V1.1.1 (2009-09) "Digital Video Broadcasting (DVB); Framing structure Channel Coding and Modulation for a Second Generation Digital Terrestrial Television Broadcasting System (DVB-T2)"). Hence, it comprises an FEC encoding block 21 for subsequent LDPC encoding, a bit interleaver 22, a demultiplexer 23 for demultiplexing bits to cells, a constellation mapper 24 for mapping cells to constellations according to Gray mapping, a unit 25 for constellation rotation and cyclic Q-delay, a cell interleaver 26 and a time interleaver 27. The function and operation of these units 21 to 27 is generally known and, for instance, described in the DVB-T2 standard, which is herein incorporated by reference, so that no further explanations are provided here.

The second encoding unit 30, i.e. the lower branch, is also provided with the transmitter input data stream I1 in this embodiment. The FEC encoding block 31 is generally not identical to the FEC encoding block 21 of the first encoding unit 20. While said FEC encoding block 21 appends to the input data words parity bits of an LDPC codeword, said LDPC parity bits being generally referred to herein as basic parity portion of a first code, the FEC encoding block 31 generates additional redundancy to increase the robustness of the overall channel code, said overall channel code referring to the redundancy from both FEC encoding blocks 21 and FEC encoding blocks 31. In other words, the FEC encoding block 31 generates auxiliary parity bits that can, in addition to the basic parity bits, be used by a receiver to decode a received codeword as will be explained in more detail below.

The consecutive blocks 32 to 37 can generally be identical to the blocks 22 to 27 and can thus be adopted from the DVB-T2 standard, but can also be adjusted according to the specific circumstances and needs of the second encoding unit 30. The application of a time interleaver 37 is optional since applying time interleaving within just one frame of auxiliary parity bits is already covered within the cell interleaver 36. However, applying time interleaving over more than one auxiliary parity data frame allows for more time diversity.

In this embodiment, the input of the two FEC encoding blocks 21, 31 is identical, in particular an input data stream I1*, which substantially corresponds to the transmitter input data stream, but wherein to the input data words (BBFrames in the context of DVB) parity bits of a BCH codeword have been added by a BCH encoder 40 (as is generally known in the art of DVB). Hence, the input data stream I1 has already been encoded by a BCH code, before further encoding is performed in the FEC encoders 21 and 31. It should, however, be noted that the encoder 40 is generally not an essential element of the present invention. In certain application the encoder 40 can be completely omitted, can be replaced by a different encoder or this initial encoding can be part of the encoding performed in the encoders 21 and 31.

Further, it shall be noted that hereinafter it is generally referred to parity "bits" and input data "bits". The same idea is, however, also applicable using parity "bytes" and input data "bytes" or, generally, parity "symbols" and input data "symbols".

The outputs of the first and second encoding units 20, 30 are fed forward to a data mapper 16, generally including a frame builder, and, optionally, an OFDM generator. The data mapper 16 and the OFDM generator may generally operate according to the DVB-T2 standard which particularly shows embodiments of these blocks. For mapping the outputs of the first and second encoding units 20, 30, however, various embodiments exist which will also be explained below in more detail.

Figure 3A:
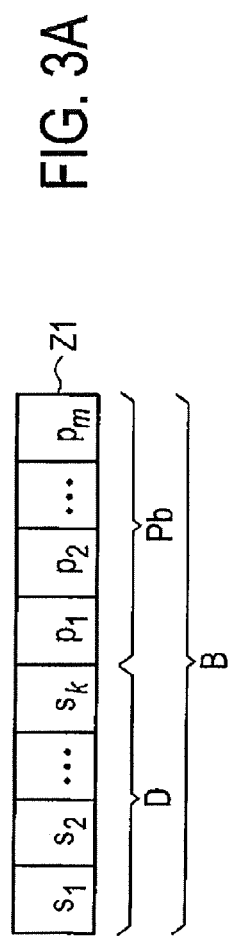
FIG. 3 shows the arrangement of a data portion, a basic parity portion and an auxiliary parity portion according to the present invention.

By way of FIG. 3 the encoding performed in the FEC encoding blocks 21 and 31 shall be explained in more detail. FIG. 3A shows a first codeword Z1 which is the output of the FEC encoding block 21. Said first codeword Z1 comprises a data portion D, which generally corresponds to the input data word of the FEC encoding block 21 and which, according to this embodiment, comprises k input data bits $s_1$, $s_2, \ldots s_k$, and a basic parity portion Pb comprising, in this embodiment, m parity bits $p_1, p_2, \ldots, p_m$. This first codeword Z1 generally corresponds, in the context of DVB-T2, to the LDPC codeword belonging to a code $C_1$ with code rate $R_1=k/(k+m)$, where k is the amount of the systematic bits (input data bits) s and m is the amount of the basic parity bits p. By use of these codewords a receiver, in particular a stationary receiver and/or a mobile receiver that is not affected by too many disturbances, is able to decode the input data encoded therein.

Figure 3B:
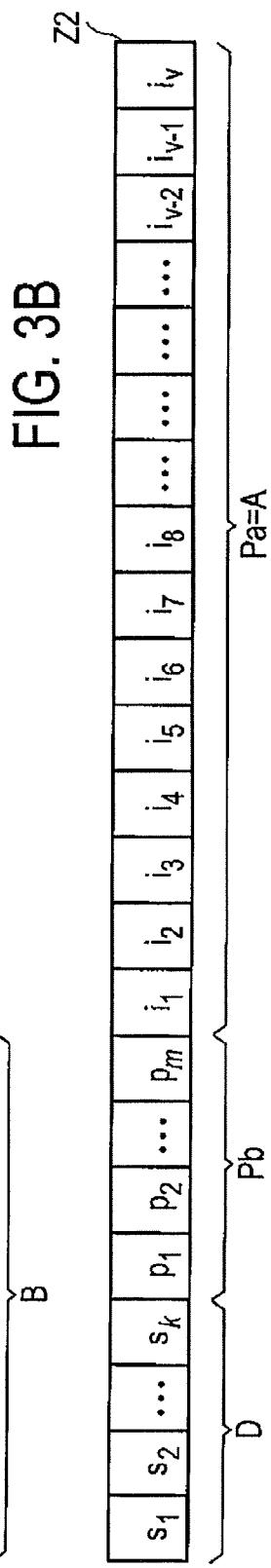

The second codeword Z2 shown in FIG. 3B belongs to a second code $C_2$ of a lower code rate $R_2=k/(k+m+V)<R_1$. Said second codeword Z2 comprises, in addition to the data portion D and the basic parity portion Pb, an auxiliary parity portion Pa of v auxiliary parity bits $i_1, i_2, \ldots, i_v$. Said auxiliary parity portion Pa may be used by a receiver, for instance in case of transmissions errors, decoding errors and/or an insufficient quality of the decoding, as incremental redundancy in addition to the codeword Z1 for decoding. Hence, if the first codeword Z1 cannot be decoded correctly at the receiver, some or all of the auxiliary parity bits $i_1$, $i_2, \ldots, i_v$ may be used for decoding, in addition to the first codeword Z1, to increase the probability of correct and error-free (or at least an increased quality of) decoding. For this purpose at least the auxiliary parity portion Pa will also be mapped onto the transmitter output data stream for eventual reception and use by the receiver. Said mapping will be explained below in more detail.

Hence, the combination of the codeword Z1 and the auxiliary parity portion Pa (of the second codeword Z2) can also be regarded as a "total" codeword of a "total" code having a lower code rate than the first code of the codeword Z1, i.e. the codeword Z1 can be regarded as a basic codeword portion B of this "total" codeword and the auxiliary parity portion Pa can be regarded as a auxiliary parity portion A of this "total" codeword. Here in this embodiment shown in FIG. 3 this "total" codeword is identical to the codeword Z2. This does, however, not hold for all embodiments as will be shown below.

Figure 4:
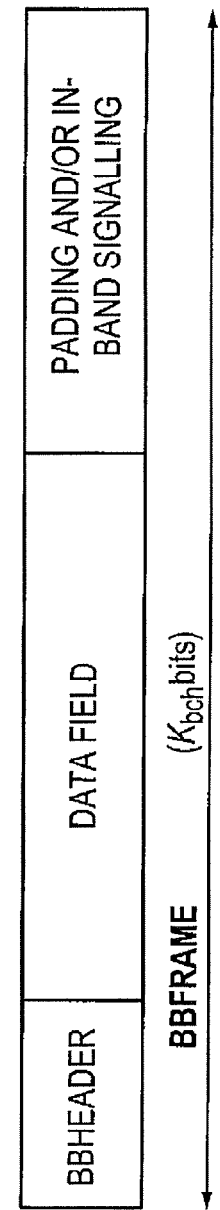
FIG. 4 shows the format of a BBFrame according to the DVB-T2 standard.

In the context of DVB-T2 the transmitter input data stream to the encoder 14 is generally segmented into frames referred to as BBFrames comprising $K_{bch}$ bits as exemplarily depicted in FIG. 4. A first codeword Z1 (in this context) generated therefrom by the BCH encoder 40 and the first encoding block 21, i.e. in accordance with the encoding as performed according to the DVB-T2 standard, is schematically depicted in FIG. 5. This codeword is a standard FEC codeword comprising the (systematic) input data portion, which itself consists of $K_{bch}$ bits, followed by $N_{bch}-K_{bch}$ parity bits of the BCH encoder, followed by $N_{ldpc}-K_{ldpc}$ parity bits of the LDPC encoder. In total, this codeword comprises $N_{ldpc}$ bits. Hence, the basic LDPC code has a code rate of $R_c=K_{ldpc}/N_{ldpc}$. Referring to the above explanations provided with reference to FIGS. 3 and 4 $K_{ldpc}$ corresponds to k (i.e. the portions BBFRAME and BCHFEC are regarded as the input data word D) and $N_{ldpc}$ corresponds to k+m (i.e. the portion LDPCFEC is regarded as the basic parity portion Pb).

The second encoding block 31 computes auxiliary parity bits for use as incremental redundancy, based on its input, which generally is the same as the input of the FEC encoding block 21. In general, these are v auxiliary parity bits which can be partitioned into q sub-portions. The k-th sub-portion is of length $v^{(k)}$. Thus, it holds $$\sum_{k=1}^{q} v^{(k)} = v.$$

If the bits from the first x sub-portions are then appended to the first basic codeword (Z1) generated by the first encoding unit 20 and generally received and evaluated by a receiver, an auxiliary codeword (Z3*) of the "total" code is generated which stems from an encoder with the overall code rate $R_c^*$ of $$R_c^* = \frac{k}{k + \sum_{k=1}^{x} v^{(k)}} < R_c$$

which is smaller than $R_c$, which means that this overall code is more powerful.

FIG. 6 shows such an embodiment of a codeword Z2 (in the context of DVT-T2) generated by the second FEC encoding block 31 which, according to this embodiment, also comprises BCH and LDPC encoding, but additionally generates v auxiliary parity bits for use as incremental redundancy at the receiver in case of need.

Figure 19:
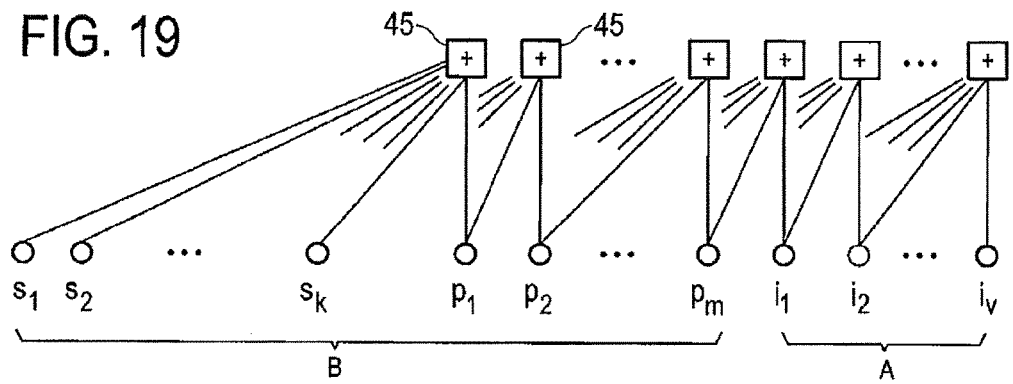
FIG. 19 shows a diagram illustrating the generation of the bits of a codeword according to the present invention.

The generation of additional LDPC parity bits, e.g. of a known LDPC code, and their use as incremental redundancy is generally known, e.g. from Kim J. et al. "Design of Rate-Compatible Irregular LDPC Codes for Incremental Redundancy Hybrid ARQ Systems", ISIT 2006, Seattle, USA, Jul. 9-14, 2006. A diagram illustrating such an "extended" code and its generation is shown in FIG. 19. Therein, it is shown how each of the bits of the basic codeword portion B and of the auxiliary parity portion A are generated from other, in particular all "previous" bits in the codeword by use of modulo-2 units 45. This way of generating the codeword ensures that a decoder can decode a codeword by use of only the basic codeword portion B or by additional use of one or more of the auxiliary parity bits of the auxiliary parity portion A.

Next, an embodiment of the data mapper 16 shall be explained. Generally, it is sufficient if the first codeword (generally, the basic codeword portion B) generated by the first encoding unit 20 and the auxiliary parity portion (generally, the auxiliary codeword portion A) generated by the second encoding unit 30 for the same input data word are mapped in any way onto the frames of the transmitter output data stream O. In other words, using the terminology from FIG. 3, for each input data word the corresponding data portion D, the basic parity portion Pb and the auxiliary parity portion Pa are mapped onto the transmitter output data stream O according to the present invention. Preferably, however, the data mapper 16 is adapted such that the data portion D and the basic parity portion Pb are mapped onto a different portion, for instance onto a different frame, than the corresponding auxiliary parity portion Pa of the same codeword. This provides the advantage that regular channel disturbances do generally not affect both the data portion D and the basic parity portion Pb on the one hand and the auxiliary parity portion Pa on the other hand.

Figure 7:
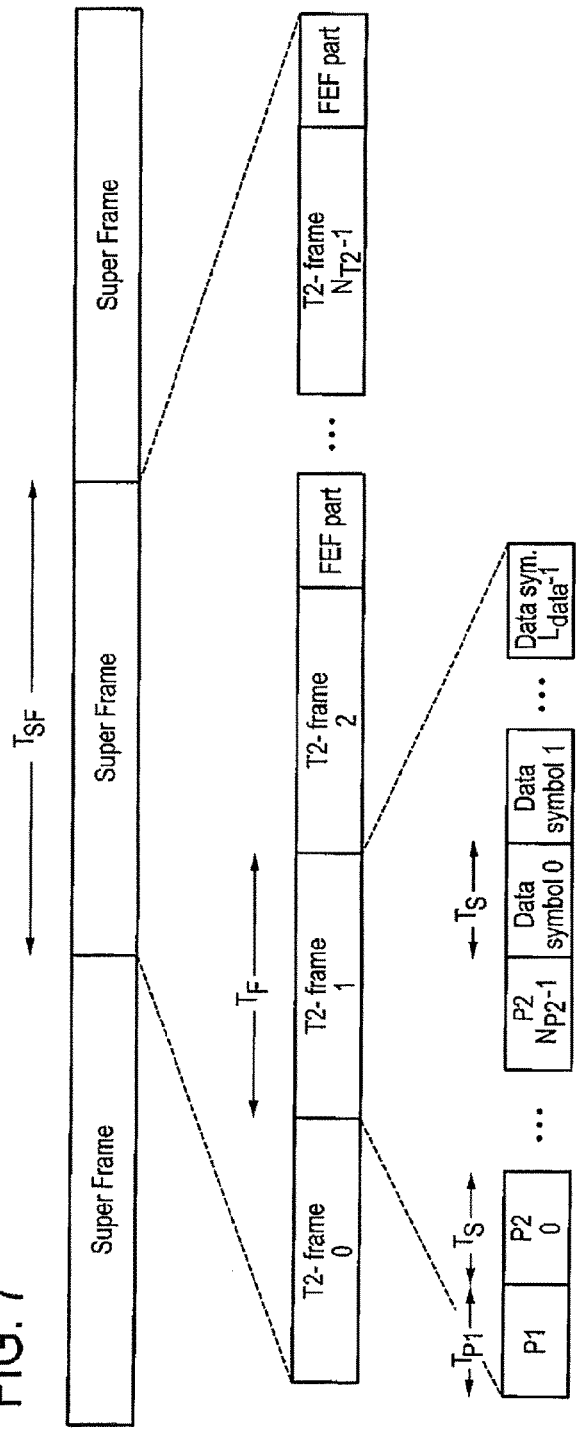
FIG. 7 shows a diagram illustrating the DVB-T2 framing structure.
Figure 8:
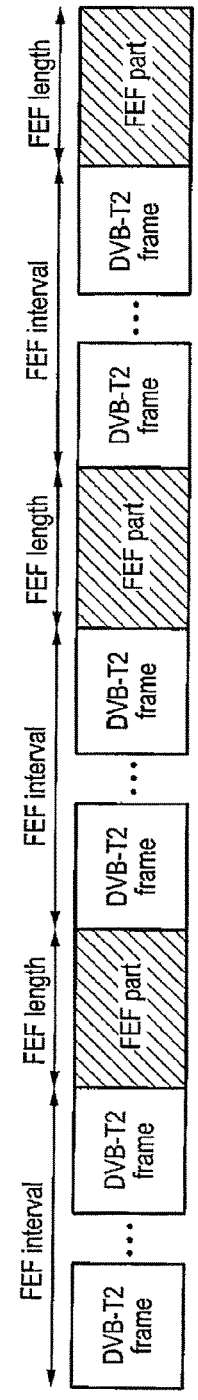
FIG. 8 shows a diagram illustrating the arrangement of T2 frames and FEF frames within a superframe in accordance with the DVB-T2 standard.

A particular embodiment for such a mapping structure shall be illustrated with reference to FIGS. 7 and 8. FIG. 7 illustrates the framing structure as applied according to the DVB-T2 standard. In particular, according to DVB-T2, a superframe structure is applied where each superframe is subdivided into a multitude of T2 frames. After each predetermined number of consecutive T2 frames an FEF part (Future Extension Frame part) is inserted for future use. This is also schematically illustrated in the data stream structure shown in FIG. 8. When applying such a framing structure in the transmitter 10 according to the present invention, the data mapper 16 is adapted in one embodiment such that the data portion and the basic parity portion of a codeword, which can also be regarded as the basic codeword portion B and, in this embodiment, the basic codeword Z1 (see FIG. 3A), are mapped onto the T2 frames and that the auxiliary parity portion Pa (generally the auxiliary codeword portion A) of the same codeword (taken from the auxiliary codeword Z2) is mapped onto the FEF part, preferably the FEF part following next to the T2 frame(s) into which the corresponding data portion D and basic parity portion Pb are mapped.

Such a mapping provides the advantage that a conventional receiver in accordance with the DVB-T2 standard simply ignores the data transmitted in the FEF parts and only evaluates the data transmitted in the T2 frames as usual. Mobile receivers, however, for instance in accordance with the upcoming DVB-NGH standard, whose decoding and reproduction capability may often be affected by disturbances, may also access the T2 frames and decode, in a first step, the codewords embedded therein. In addition, however, particularly in case of disturbances and decoding errors resulting therefrom, such mobile receivers access the FEF parts and use parts or all of the auxiliary parity data contained therein for decoding, in a second step, the codeword received in the corresponding T2 frame again, as will be explained in more detail below.

According to still another embodiment of the data mapper 16 all data required for decoding by a mobile receiver are transmitted in the FEF parts, i.e. a complete codeword comprising the data portion D, the basic parity portion Pb and the auxiliary parity portion Pa is mapped onto the FEF part. Such mobile receivers thus ignore the data contained in the T2 frames which are only accessed by stationary receivers, in particular receivers in accordance with the DVB-T2 standard.

In such a situation, however, the auxiliary parity portion Pa is preferably modulated in a different way than the data portion D and the basic parity portion Pb. Preferably, an auxiliary modulation code is applied for modulating the auxiliary parity portions, said auxiliary modulation code being orthogonal to a basic modulation code that is used for modulating the data portions and the basic parity portions, generally after the data mapping. For instance, an orthogonal time, frequency, space (MIMO) or a spreading code may be applied. Another possibility would be the application of hierarchical modulation.

Of course, there may be further embodiments of the data mapper 16. The framing structure applied by the transmitter 10 may also be completely different than the framing structure used according to the DVB-T2 standard as shown in FIGS. 7 and 8. Generally, any framing structure, e.g. a newly created framing structure, may be applied as long as the receiver is able to detect or know in advance where to find the data portions and the various parity portions. Further, in embodiments of the invention BCH and LDPC encoding is not required, but other codes (e.g. other FEC codes) can be applied.

A simplified block diagram of another embodiment of an encoder 142 and a data mapper 16 is shown in FIG. 9. According to this embodiment the encoder 142 comprises a single encoding unit by which the input data words are encoded, i.e. by which both the basic parity portions Pb and the auxiliary parity portions Pa are generated. In other words, in said single encoding unit of the encoder 142 the complete codeword Z2 (see FIG. 3B) is generated. These codewords Z2 are provided to the data mapper 16 which splits off the auxiliary parity portion Pa and maps it onto a different portion of the transmitter output data stream than the data portion D and the basic parity portion Pb. For the data mapper 16 generally the same embodiments exist as have been explained above.

As shown in FIG. 1 the data input 12 may be adapted for not only receiving a single transmitter input data stream, but may generally receive a number n of transmitter input data streams, for instance a number n of physical layer pipes. The encoder 14 may, in such a case, however be adapted to select if a transmitter input data stream is encoded as usual, i.e. according to the basic code and without the generation of any auxiliary parity data, or if another code having a lower code rate shall be applied and auxiliary parity data for use as incremental redundancies by the receiver shall be generated. It may also be possible that various codes with different (e.g. decreasing) code rates may be available for application by the encoder so that even more than two possibilities exist. Which code and which code rate to apply may be prescribed, e.g. by the operator of the transmitter or the owner of the broadcast channel. But the choice of the code may also depend on the kind of data to be transmitted. For instance, audio data may be encoded with a code having a higher code rate than video data so that only for video data such auxiliary parity data are generated or vice versa. As another example, any decoding errors may be acceptable when watching news, but may not be acceptable when watching a movie for which auxiliary parity data may thus be generated and transmitted.

A still further embodiment of an encoder 143 is illustrated in FIG. 10. Said encoder 143 is adapted such that it generates two or more auxiliary parity sub-portions Pa1, Pa2, Pa3 in addition to the data portion D and the basic parity portion Pb thus forming a codeword Z3. Hence, comparing the codewords Z2 and Z3, the auxiliary parity sub-portions Pa1, Pa2, Pa3 of the codeword Z3 can be seen as segments of the auxiliary parity portion Pa of the codeword Z2, having in total the identical content, although generally the auxiliary parity sub-portions Pa2 and Pa3 can also be additional auxiliary parity portions in addition to the auxiliary parity portion Pa1 that (alone) corresponds to the auxiliary parity portion Pa.

These auxiliary parity sub-portions Pa1, Pa2, Pa3 are generated such that they can be stepwise used by a decoder as incremental redundancies. In other words, generally it is possible to decode the codeword by use of only the data portion D and the basic parity portion Pb (i.e. the basic codeword portion). If such decoding fails, the first auxiliary parity sub-portion Pa1 (i.e. a part of the auxiliary codeword portion) may be used in addition for decoding. If this again fails (or provides insufficient quality) the second auxiliary parity sub-portion Pa2 may be added and so on.

All the auxiliary parity sub-portions Pa1, Pa2, Pa3 may be grouped together and mapped onto a single portion of the transmitter output data stream. However, it is also possible and advantageous to distribute the various auxiliary parity sub-portions of a single codeword Z3, preferably such that the first auxiliary parity sub-portion Pa1 is received before the second auxiliary parity sub-portion Pa2, which again is received before the third auxiliary parity sub-portion Pa3. This provides the advantage that a receiver which, after using the first auxiliary parity sub-portion, can decode the codeword with sufficient quality, can fall into sleeping mode for the time period during which other auxiliary parity sub-portions are transmitted that are no longer needed and/or from other data streams that shall currently not be decoded. This provides some power saving and less calculation efforts at the receiver.

An embodiment of the arrangement of auxiliary parity sub-portions of various input frames (BBFrames, generally referred to as input data words) is shown in FIG. 11. The input frames are enumerated in this embodiment by two indices (e, f), where the index e corresponds to the PLP_ID (PLP number, also referred to here as the number of the transmitter input data stream), and where f relates to the input frame (input data word). The index e is part of a set $S_2$, i.e., the set of PLPs that are protected by additional incremental redundancy. Assuming that n different PLPs are transmitted, i.e. $e \in S_1 = \{1, \ldots, n\}$, $S_2$ is a subset of $S_1$ of PLPs that are protected by additional incremental redundancy according to the present invention since, as mentioned above, not all PLPs need necessarily use this idea.

Thus, the f-th input frame of the e-th PLP is denoted as $I_{e,f}$. The index $f \in \{1, \ldots, F_e\}$, where $F_e$ is the number of input frames of the e-th PLP, which precede the FEF, starting from the end of the previous FEF. Hence, in one embodiment, the auxiliary parity sub-portions $Pa1_{e,f}$ up to $Pay_{e,f}$ may be mapped onto an FEF frame in the sequence as shown in FIG. 11 and may belong to codewords mapped onto preceding T2 frames.

Figures 12, 13:
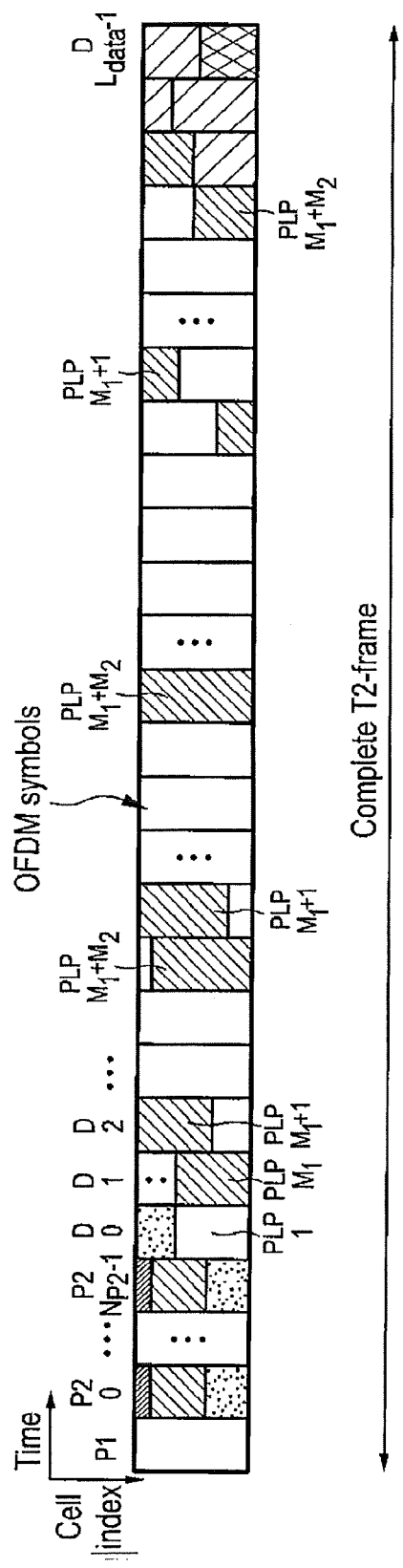
FIG. 12 shows the mapping of data PLPs onto a T2 frame according to the DVB-T2 standard.
FIG. 13 shows the mapping of segmented auxiliary parity portions onto an FEF frame.

FIG. 12 illustrates more details of the arrangement of data within a T2 frame in accordance with the DVB-T2 standard. The PLPs in a T2 frame underlie a certain order. After the preambles P1, P2 and after common PLPs the PLPs of type 1 are transmitted without subslicing, then PLPs of type 2 are transmitted with subslicing. Both type 1 and type 2 PLPs have a fixed order which is signalled in the P2 preamble. This is also illustrated and explained in detail in the DVB-T2 standard, which explanation is herein incorporated by reference.

FIG. 13 shows a proposal for arranging the auxiliary parity sub-portions in an FEF frame that is made similar to the arrangement of the PLPs in the T2 frame. In this embodiment the FEF also starts with a P1 preamble, i.e. an OFDM symbol, which is made to be used for (time, frequency) synchronization purposes, for channel estimation and for signalling the most important transmission parameters. The subsequent (one or more) P2 preamble(s) contain(s) more detailed information about the content of the FEF. Using the notation explained with reference to FIG. 11 and assuming that there are two PLPs of three input frames each, the arrangement of the auxiliary parity sub-portions in the FEF in this embodiment is such that the order of the partitioned auxiliary parity sub-portions is derived from the slicing/ordering of the T2 frames, even if not all PLPs from T2 frames have auxiliary parity sub-portions to be mapped onto the FEFs. Thus, the order of the auxiliary parity sub-portions does not have to be signalled explicitly.

The auxiliary parity portions are sorted in the time domain, in particular such that the first portion $Pa1_{e,f}$, for instance the more robust portion, of all PLPs having auxiliary parity portions is inserted at the beginning of the FEF, i.e. right after the preambles P1, P2. The second portion Pa2 of all PLPs with auxiliary parity portions follows afterwards etc. As mentioned above, if basic codewords are not decodable the related first portion Pa1 of the FEF is evaluated. If the receiver can now correctly decode the overall codeword without error it falls into sleeping mode to save power. Otherwise it will additionally include the second auxiliary parity portion Pa2 etc.

It shall be noted also that the FEFs may contain signalling information, e.g. in the preamble or in a ModCod header, regarding the link of the auxiliary parity portions used in the FEFs and the PLPs mapped onto the T2 frames (which itself remain unchanged in this embodiment). Further, other data may be contained in the FEFs as well, for instance low-bitrate information for use by a mobile receiver.

Figure 14:
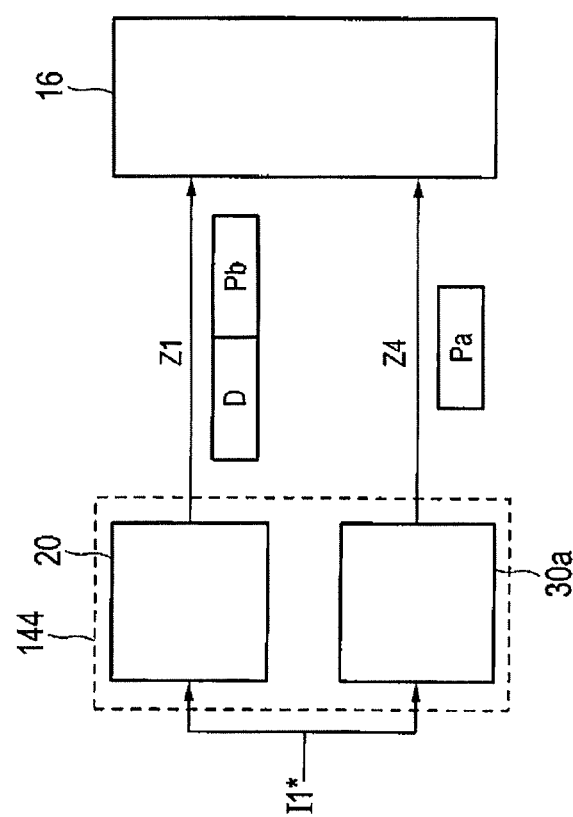
FIG. 14 shows a schematic block diagram of a fourth embodiment of an encoder.

FIG. 14 shows still another embodiment 144 of an encoder according to the present invention. Similar to the embodiment shown in FIG. 2 the encoder 144 comprises a first encoding unit 20 for encoding, according to said first code, the input data word into said basic codeword Z1 as explained above. Further, a second encoding unit 30a is provided for encoding, according to said second code, the input data word into an auxiliary codeword portion (which can be regarded as an auxiliary codeword Z4) comprising only said auxiliary parity portion Pa. Hence, the second encoding unit 30a only generates the data ultimately necessary for improving decoding at the decoder, if required, but does not generate other codeword portions that are already generated by the first encoding unit 20.

Figure 15:
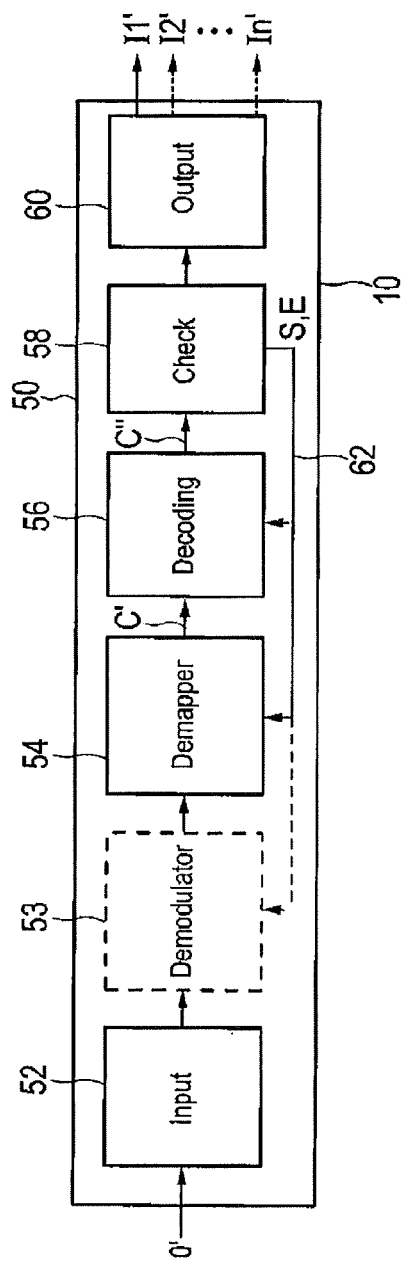
FIG. 15 shows a schematic block diagram of a receiver.

FIG. 15 shows a schematic block diagram of a receiver 50 for use in a broadcasting system comprising a transmitter 10 as illustrated above. The receiver 50 is particularly adapted for making use of the auxiliary parity portion (generally, the auxiliary codeword portion) as incremental redundancy in case of erroneous or low quality decoding.

The receiver 50 comprises a data input 52 for receiving a receiver input data stream O' which generally corresponds to a transmitter output data stream O that has been transmitted over a broadcast channel of the broadcasting system by a transmitter and which may thus be affected by disturbances that may appear in such a broadcasting system, particularly in case of using mobile receivers which are the main application of the present invention on the receiver side.

Optionally, a demodulator 53 is provided that is interrelated with the (optional) modulator 17 of the transmitter 10 for demodulating the received receiver data input stream O'. A demapper 54 demaps the (optionally demodulated) receiver data input stream O', particularly at least the data portions and the basic parity portions (i.e. the basic codeword portions) of the codewords mapped into the receiver data input stream O' as will be explained below in more detail. A decoder 56 then decodes these codewords by use of the basic codeword portions according to the same code as applied by the encoder 14 of the transmitter 10. As particularly in case of mobile receivers severe disturbances, for instance due to the high velocity of the moving receiver, might appear a check unit 58 is provided in the receiver 50 by which it is checked if decoding has been made correctly and/or with sufficient quality and/or below a tolerable error level as will be explained below. If the decoding is made without errors or with sufficient quality the decoded data are provided to an output unit 60. The output thereof might be one or more receiver output data streams I1' I2', . . . , In' which should as much as possible correspond to the transmitter input data streams I1, I2, . . . , In.

If, however, the check by check unit 58 shows that a decoding is erroneous or that the decoded data have an insufficient quality and would, for instance, result in a noisy receiver output signal (e.g. insufficient picture quality of a movie), a feedback loop 62 is provided from the check unit 58 to the demapper 54 and/or the decoder 56 in order to make use of the auxiliary parity portion (generally, the auxiliary codeword portion) (completely or in part) for improving the quality of decoding. Hence, in such a situation the demapper 54 then also demaps the auxiliary parity portion (completely or in part) from the (optionally demodulated) receiver input data stream O'. By use of this additional redundancy the decoder 56 will then again decode the received codewords, but now applies a code having a lower code rate which thus has a higher robustness against the disturbances. Hence, there is a high likelihood that the decoding quality will be better than before. In some embodiments, a feedback loop 62 is also provided from the check unit 58 to the demodulator 53, e.g. if auxiliary parity portions are required by the decoder 56 from another receiver input data stream, e.g. from data received at a different antenna in a MIMO receiver or from another channel (e.g. using another frequency).

Thereafter, again a check can be made by the check unit 58 if the decoding has now been made error-free or with sufficient quality, and, if not, a still further part of the auxiliary parity portion can be used in another iteration of demapping and decoding. If, on the other hand, the complete auxiliary parity portion of a codeword has already been completely used for decoding the check can also be omitted and the decoded data can be outputted directly.

Figure 16:
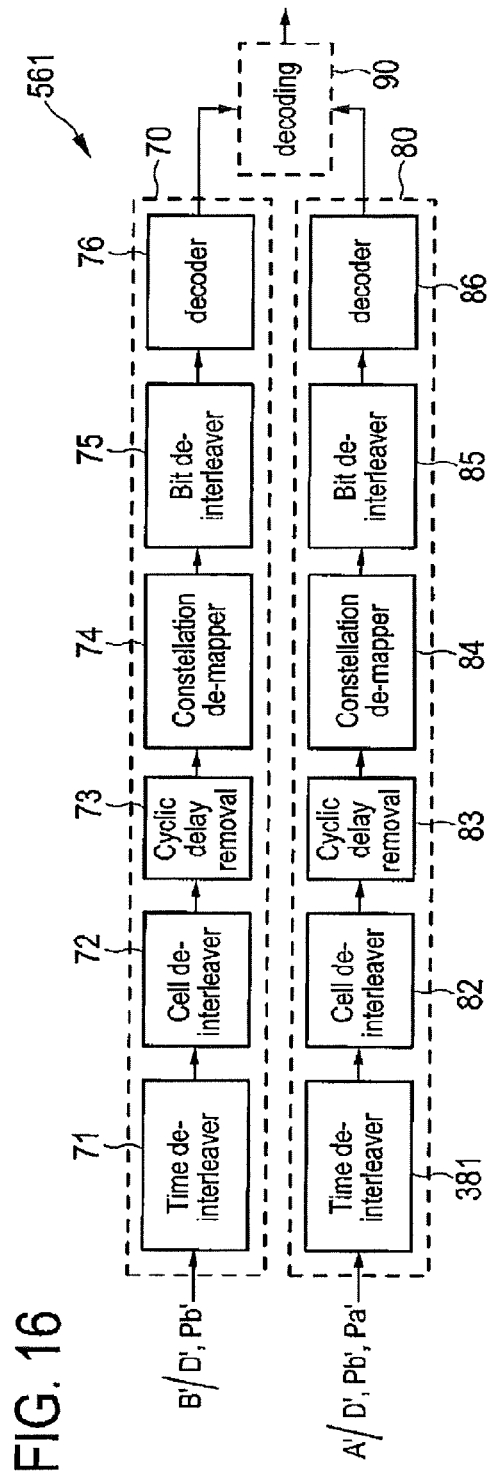
FIG. 16 shows a schematic block diagram of a first embodiment of a decoder used in the receiver.

Similarly as for the encoder 14 of the transmitter 10 there exist various embodiments of the decoder 56 of the receiver 50. A first embodiment 561 of the decoder 56 is schematically depicted in FIG. 16. According to this embodiment the decoder 561 comprises a first decoding unit 70 and a second decoding unit 80, similarly as the embodiment of the encoder 141 depicted in FIG. 2. Further, an additional decoder 90 (e.g. a BCH decoder) is provided for BCH decoding the output of the decoder 561, if the corresponding transmitter used in the broadcasting system applies a step of BCH encoding. The first decoding unit 70 generally corresponds to the decoding unit as used in receivers in accordance with the DVB-T2 standard. It comprises a time deinterleaver 71, a cell deinterleaver 72, a cyclic delay remover 73, a constellation demapper 74, a bit deinterleaver 75 and a first LDPC decoding block 76. Such a decoder is, for instance, explained in more detail in the DVB document A133, February 2009 "Implementation Guidelines for a Second Generation Digital Terrestrial Television Broadcasting System (DVB-T2)" which is herein incorporated by reference. This first decoding unit 70 thus is provided with the data portions D' and the basic parity portions Pb' (generally the basic codeword portion B') as demapped by the demapper 54 from a received receiver input data stream O' and decodes, as usual, these codewords.

In addition, in this embodiment of the decoder 561 a second decoding unit 80 is provided which basically comprises the same elements, in particular a time deinterleaver 81, a cell deinterleaver 82, a cyclic delay remover 83, a constellation demapper 84, a bit deinterleaver 85 and a second decoding block 86, whose function is identical to the function of the respective elements of the first decoding unit 70. However, the parameters of those blocks may differ, if different parameters are applied in the encoder, e.g. in the second encoding unit 30 (see FIG. 2). The second decoding unit 80 is, however, provided, in addition to the data portions D' and the basic parity portions Pb', with the additional auxiliary parity portion Pa' (generally the auxiliary codeword portion A') (completely or in part) for decoding the codewords with high reliability using said auxiliary parity portion Pa' as redundancy information. Hence, the second decoding unit 80 only becomes active in case of need, i.e. if "instructed" by the check unit 58 through feedback loop 62. Alternatively, the second decoding unit 80 is provided with only the auxiliary codeword portion A'.

Figure 17:
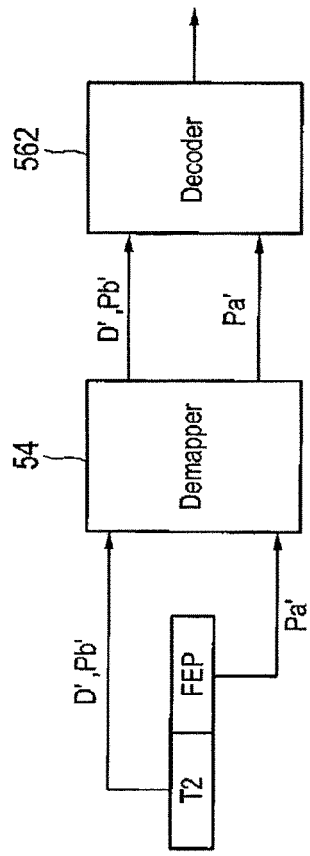
FIG. 17 shows a schematic block diagram of a second embodiment of a decoder.

An alternative embodiment 562 of a decoder is depicted in FIG. 17. According to this embodiment the demapper 54 accesses the T2 frames of a received receiver data input stream O' to demap the data portions D' and the basic parity portions Pb' therefrom and accesses FEF frames to demap the auxiliary parity portions Pa' therefrom, i.e. the demapper 54 is adapted to interrelate with the mapper 16 as illustrated in FIG. 9. The decoder 562, however, only comprises a single decoding unit which is both able to decode the codewords according to the first code (with a higher code rate) based on only the data portion D' and the basic parity portion Pb' and according to the second code (with a lower code rate) using as redundancy information (part of or all of) the auxiliary parity portion Pa', if needed.

A standard LDPC decoder as, for instance, provided in a DVB-T2 receiver accepts at its input a (channel disturbed) codeword, as well as signalling information about the code rate and the length of the codewords (either 16200 or 64800 bits). Based on the signalling information, it applies an appropriate decoding algorithm (typically so called iterative message passing) based on that particular code realization and outputs an estimate of the data portion.

The same applies for an extended LDPC decoder included in the decoder 56, in particular the extended LDPC decoder 76 and 86, which receive in addition auxiliary codeword portion, in particular auxiliary parity bits. The number of auxiliary bits is generally signalled in addition to the applied code rate and the length of the basic codeword portion to the decoder. Given these parameters, the decoder 56 applies an appropriate decoding algorithm based on this extended (or "total") code.

As mentioned above, in a preferred embodiment the demapper and the decoder are preferably adapted to stepwise add more parts ("sub-portion") of an auxiliary parity portion to improve the decoding. Preferably, once a sufficient decoding quality has been reached the demapper and the decoder are adapted for going into a sleeping mode while other parts of the (segmented; see for instance FIG. 13) auxiliary sub-portions are provided in a received receiver input data stream, i.e. those additional segments of an auxiliary parity sub-portion are preferably not demapped and used for decoding. This particularly saves power in the receiver which is especially advantageous in case of mobile receivers using a battery as power source.

A generic LDPC decoder has as input a received codeword (with or without additional parity bits) as well as signalling information about the code rate and the codeword length. The latter is in addition implicitly updated by the feedback loop 62, which signals, if (and how many) auxiliary parity bits are appended. In contrast to such a generic decoder, the LDPC decoder in the decoder 56 according to the present invention outputs its estimates on each code bit of the (received) codeword C', i.e. an estimate C" on the codeword C'. Preferably, the bitwise estimates are expressed in terms of log likelihood ratios (LLRs), whose magnitude reflects the reliability of the estimate.

If the check unit 58 decides that the estimate C" is probably the transmitted codeword C, it outputs the (hard decided) estimates of the data portion D' and sets a flag S to 1, which corresponds to a decoding success. Otherwise, S=0, which is signalled within the feedback loop 62 to initiate the suffixing of auxiliary parity bits (if still available). The indicator E from the check unit 58 is optional and gives an estimate of how many additional auxiliary parity sub-portions are still needed. In case of E>1, the LDPC decoder 56 does not even have to try to decode the next larger codeword, but has to wait for E additional auxiliary parity sub-portions to restart decoding.

The criteria for decoding success (S=1) are:

a) Within a maximum number of allowed decoder processing steps (typically a maximum number of iterations is imposed), a valid codeword C" (after hard decision) is found.

b) The estimate of the data portion D' (can be derived from the estimate C", or is even included in C", in case of a systematic code (as in DVB-T2)) can be decoded by a BCH decoder. Note that the BCH decoder has also some error detection capabilities.

c) After BCH decoding, the stream I1' should correspond to a BBFrame, whose header (BBHeader) is protected by a CRC. If this check is successful, the likelihood that the whole BBFrame is correct, is increased.

d) Preferably, the reliabilities of all LLRs (log-likelihood ratios) are checked by check unit 58. This could be done by averaging the magnitudes of all LLRs belonging to the codeword. If this average is larger than a certain threshold (which depends on the code and has to be defined), a decoding success is very likely.

If S=0, the last criterion (d) can also offer an estimate of how unreliable the codeword (after decoding) is. Assuming that the following auxiliary code portions have a similar quality than the previous codeword, an estimate E can be made about how many additional portions are needed for successful decoding.

It should be noted that there a two ways of combining the previous codeword (which the decoder wasn't able to decode correctly) with the auxiliary code word portions:
1) store the previous codeword, which entered the decoder, and append the auxiliary codeword portion at its end or
2) store the final estimate C" of the LDPC decoder 56 (e.g. after the maximum number of iterations has passed) and append the auxiliary codeword portion at its end.

In addition to the embodiments explained above the encoder of the transmitter may also be adapted such that the auxiliary parity portion (generally, the auxiliary codeword portion) may not (only) comprise "real" parity information, but that it may also comprise a repetition of (part of or all) of the information of the "basic" codeword, i.e. (some or all) bits of the data portion D and/or the basic parity portion Pb (i.e. of the basic codeword portion). Hence, in a very simple embodiment, the auxiliary parity portion Pa simply comprises a copy of the data portion D and/or the basic parity portion Pb. This will also improve decoding if the basic codeword is disturbed but the auxiliary parity portion is not (or less) disturbed. Further, even if both the basic codeword portion and the auxiliary codeword portion are disturbed, by use of both portions for decoding the result of the decoding may be improved, e.g. by applying the principle of soft combining, e.g. by improving the soft values obtained in a first decoding step using only the basic codeword portion in a second decoding step using in addition the auxiliary codeword portion.

Figure 18:
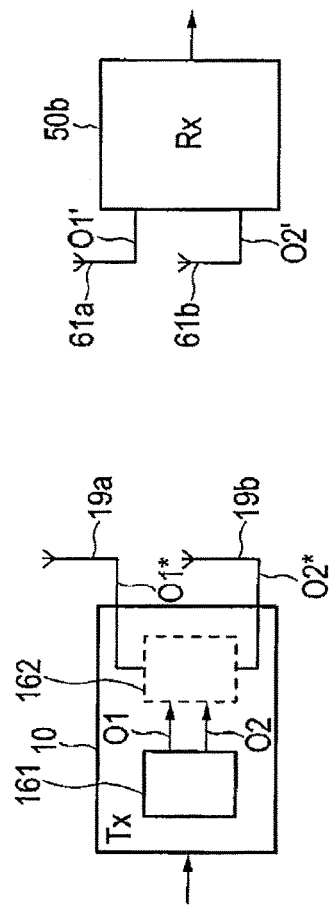
FIG. 18 shows a schematic block diagram of a broadcasting system in accordance with the present invention.

An embodiment of a broadcasting system in accordance with the present invention is schematically depicted in FIG. 18. The broadcasting system generally comprises a transmitter (Tx) 10 and one or more receivers (Rx) 50*a*, 50*b*, 50*c*. While it is generally sufficient that the transmitter 10 has a single antenna for transmitting the transmitter output data stream O, here in this embodiment the transmitter 10 is provided with two antennas 19*a*, 19*b*.

In a first mode both antennas can be used for simultaneously transmitting the identical transmitter output data stream O (or a modified stream thereof, e.g. in accordance with the Alamouti scheme of the DVB-T2 standard), for instance to increase coverage.

In another mode, that is specifically depicted in FIG. 18, the data mapper 161 provided in this embodiment of the transmitter 10 is adapted for generating two transmitter output data stream O1 and O2, wherein the data portions D and the basic parity portions Pb of codewords (i.e. the basic codeword portions) are mapped onto the first transmitter output data stream O1 and wherein the auxiliary parity portions Pa of codewords (i.e. the auxiliary codeword portions) are mapped onto the second transmitter output data stream O2. In this embodiment the first antenna 19*a* can then be provided with the first transmitter output data stream O1 for transmission and the second antenna 19*b* can be provided with the second transmitter output data stream O2 for transmission. For instance, during the transmission of T2 frames only the first transmitter output data stream O1 is transmitted, while during the transmission of FEFs both transmitter output data streams O1 and O2 are transmitted.

In still another mode, the first transmitter output data stream O1 may be transmitted by a horizontally polarized antenna, whereas the second transmitter output data stream O2 my be transmitted by a vertically polarized antenna, or vice versa.

Optionally, a MIMO precoder 162 is provided to which said first and second transmitter output data streams O1, O2 are provided from the data mapper 161 for precoding them according to any MIMO precoding scheme. For instance, the first and second transmitter output data streams O1, O2 can be spatially multiplexed onto the precoded transmitter output data streams O1*, O2* which are then transmitted by the antennas 19*a*, 19*b*, or Alamouti precoding can be applied to the first and second transmitter output data streams O1, O2. The precoded transmitter output data streams O1*, O2* may then both contain a mix of data from the first and second transmitter output data streams O1, O2.

In this embodiment illustrated in FIG. 18 the transmitter 10 is provided with two antennas 19*a*, 19*b*. It should be noted, however, that the transmitter, in particular a MIMO transmitter, comprises more than two antennas to which said precoded transmitter output data streams O1*, O2* are provided for transmission.

A first receiver 50*a* having a single antenna 61 may be adapted for receiving only the first transmitter output data stream O1 (as first receiver input data stream O1'), but not the second transmitter output data stream O2. Such a receiver 50*a* might be an existing, e.g. legacy or stationary, receiver that is not adapted for using any auxiliary parity portions at all. For instance, if the transmitter 10, particularly the second transmitter output data stream O2, is directed to reception by mobile receivers in accordance with a new standard, e.g. the DVB-NGH standard, the receiver 50*a* could be a stationary receiver in accordance with the DVB-T2 standard.

Another embodiment of the receiver 50*b* comprises two antennas 61*a*, 61*b*. In this embodiment the first antenna 61*a* is adapted for reception of the first transmitter output data stream O1 (as first receiver input data stream O1'), and the second antenna 61*b* is adapted for reception of the second transmitter output data stream O2 (as second receiver input data stream O2'). For instance, if the two antennas 19*a*, 19*b* of the transmitter 10 make use of different transmission channels, e.g. transmission frequencies, the two antennas 61*a*, 61*b* of the receiver 50*b* can be adapted for reception on the same respective transmission channel.

A third embodiment of a receiver 50*c* again has a single antenna 61, but is adapted for reception of the signals from both antennas 19*a*, 19*b*. The receiver 50*c* comprises means for internally splitting up or decomposing the two received input data streams O1', O2' accordingly.

The embodiment of the receiver 50*b*, having two separate antennas 61*a*, 61*b* for receiving the different transmitter output data streams O1, O2 separately, provides the advantage that the second antenna 61*b* and the subsequent processing means within the receiver 50*b* need only be activated if any auxiliary parity portions are required as incremental redundancies for improvement of the decoding. This holds also for an embodiment of a transmitter, where the second transmitter output data stream O2 does not only carry the auxiliary parity portions, but also the data portions and the basic parity portions of the codewords. In the latter case the transmission can be even made more stable. For instance, if the transmission channel between the transmitter antenna 19*a* and the receiver antenna 61*a* is disturbed, it can be switched to the other transmission channel between transmitter antenna 19*b* and the receiver antenna 61*b*. The advantage of a more stable transmission is also achieved with the receiver 50*c* which, in the latter case, can switch between reception of the first or second transmitter output data streams O1, O2 or which continuously receives both transmitter output data streams O1, O2. Further, such an embodiment generally also provides an increased spectral density.

In the above, particularly with respect to the transmitter 10, various embodiments have been illustrated, particularly how the data portions, the parity portions and the auxiliary parity portions are mapped onto the transmitter output data stream. Further, various examples have been given regarding the framing structure of the transmitter output data stream. It shall be understood that the data demapper 54 of the receiver 50 is, of course, adapted appropriately for demapping the required data from the receiver data input stream, i.e. the demapper 54 is aware of the particular framing structure and/or the locations at which the respective data are placed in the receiver data input stream. Known measures for signalling this information to the receiver from the transmitter and/or for prescribing this information, for instance in a standard, and for enabling the transmitters and receivers accordingly are generally applied to ensure this.

The framing structure applied according to the present invention may generally be adapted to be in consistence with the framing structure according to an existing standard, e.g. the DVB-T2 standard, so that existing receivers in accordance with this standard may also receive and process such data streams, even if they do not make use of the auxiliary parity information contained therein as incremental redundancy. However, the framing structure may be freely selected and newly created according to specific needs of the broadcasting system.

Generally, the present invention can be applied in all broadcasting systems, by which data are transmitted over a channel. For instance, the invention can be applied in a DAB system which shall be explained with reference to FIG. 20.

Figure 20:
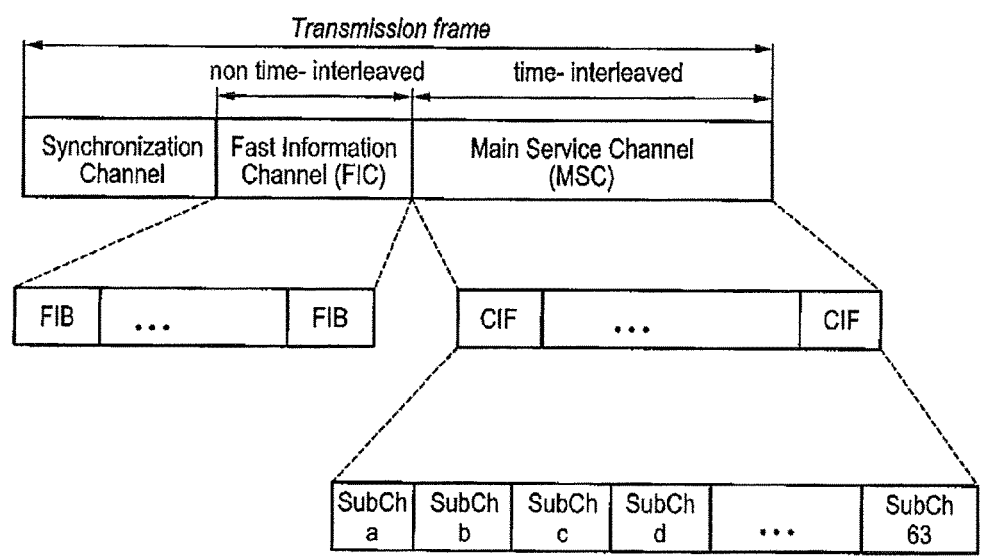
FIG. 20 shows the structure of a transmission frame as used according to DAB.

FIG. 20 shows the structure of a transmission frame as described in the DAB standard (ETS 300 401 "Radio broadcasting systems; Digital Audio Broadcasting (DAB) to mobile, portable and fixed receivers", May 1997, RE/JPT-00DAB-4). The DAB transmission system combines three channels, in particular a Synchronization Channel which is used internally with the transmission system for basic demodulator functions (e.g. transmission frame synchronization), a Fast Information Channel (FIC) which is used for rapid access of information by a receiver, which is a non-time-interleaved data channel and which can be sub-divided into Fast Information Blocks (FIBS), and a Main Service Channel (MSC) which is used to carry audio and data service components and which is a time-interleaved data channel divided into a number of sub-channels, which are individually convolutionally coded.

The MSC can also be seen as being made up of Common Interleaved Frames (CIFs), comprising Capacity Units (CU) as smallest addressable units. Each sub-channel of the MSC occupies an integral number of consecutive CUs and is individually convolutionally encoded. More details regarding the structure of the transmission frame and its content can be found in the above cited DAB standards, which explanations are herein incorporated by reference.

According to the present invention one of the sub-channels, e.g. SubCh a could comprise the basic codeword version, whereas one or more of the subsequent sub-channels, e.g. SubCh b, comprises the auxiliary codeword portion. A receiver can now process SubCh a and, if necessary, SubCh b for improving the decoding. As illustrated in an embodiment shown above the auxiliary codeword portion can be further segmented into sub-portions all carried in the same sub-channel or carried in various sub-channels. This again has the advantage that the receiver can fall into sleeping mode after successful decoding until the next basic codeword portion is transmitted.

If and for which sub-channels auxiliary parity bits are provided, could be signaled in the Fast Information Channel (FIC). Since this channel is, however, fixed and predefined, the signalling should preferably be done in another sub-channel which comprises the basic codeword portion, for instance in a newly defined header. Hence, receivers modified in accordance with the present invention can make use of this additional information. In addition, the FIC could signal, which sub-channel is adapted for reception by all DAB receivers (legacy receivers and receivers according to the present invention) and which sub-channels are decoded for reception by receivers according to the present invention (only).

The error correction code applied in DAB is a convolution code. Different code rates are generally achieved according to DAB by puncturing of a mother code. This mother code generally has a code rate of ¼, and by puncturing of certain parity bits higher code rates are obtained. These punctured parity bits could be used as auxiliary parity bits for providing incremental redundancy in accordance with the present invention. Alternatively, a completely new mother code is also applicable, from which all the DAB code rates can be obtained by puncturing and where the punctured bits are used as auxiliary parity bits in accordance with the present invention.

Figure 21:
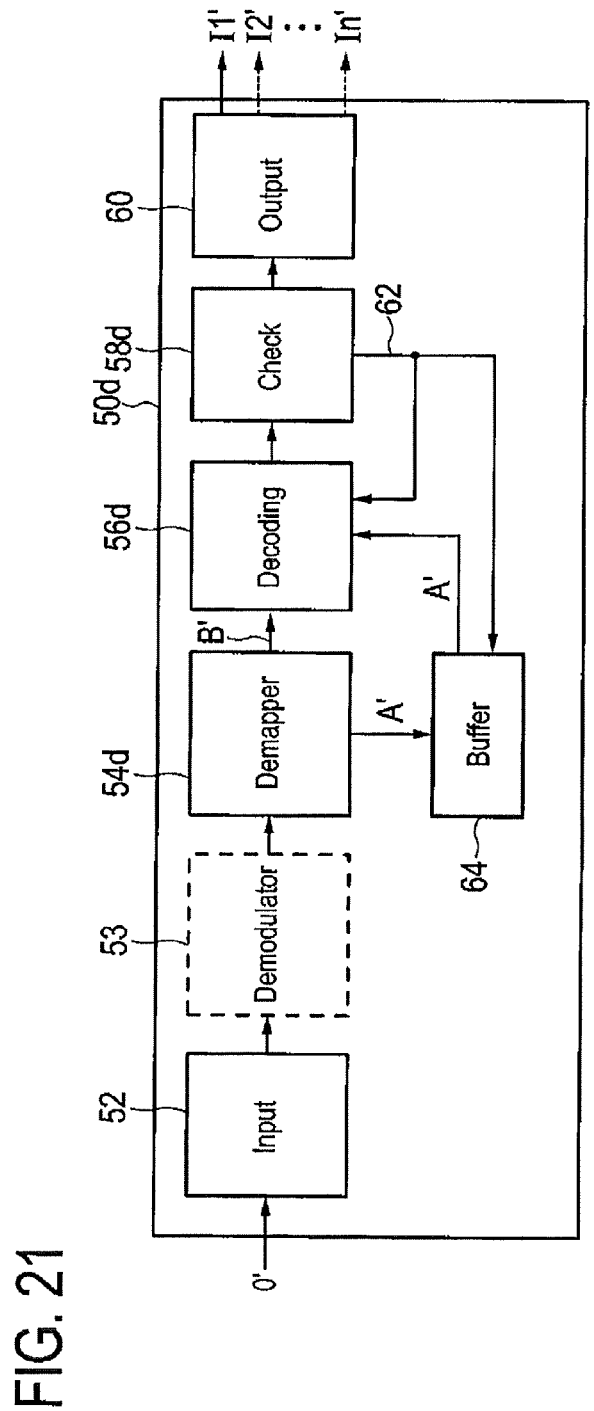
FIG. 21 shows a block diagram of another embodiment of a receiver.

FIG. 21 shows a block diagram of another embodiment of a receiver 50*d*. Generally, the basic codeword portions B and the auxiliary codeword portions A are mapped by the transmitter onto the transmitter output data stream O such that a basic codeword portion of a codeword is received by a receiver before the corresponding auxiliary codeword portion is received. Alternatively, however, the data mapper can also be adapted for mapping the basic codeword portions B and the auxiliary codeword portions A onto frames of a transmitter output data stream such that the auxiliary codeword portion of a codeword is received by a receiver before the corresponding basic codeword portion is received. For the embodiment of the receiver 50*d* shown in FIG. 21 it shall be assumed that the transmitter is adapted in this way.

In such a receiver 50*d* the data demapper 54*d* is thus adapted to demap the (first received) auxiliary codeword portions A' from the receiver input data stream O' and forward them to a buffer 64. Thereafter (whenever received) the corresponding basic codeword portions B' are demapped and forwarded to the decoder 56*d* for decoding them. If the check in the check unit 58*d* shows that additional redundancies shall be used for improved decoding the buffer 64 is informed via the feedback loop 62 to provide the buffered auxiliary codeword portion A' to the decoder 56*d* and the decoder is informed to then decode the codeword (now by additional use of the (complete or partial) auxiliary codeword portion again. If it is clear that the decoding of the corresponding codeword is correct the buffered auxiliary codeword portion (if any) is deleted from the buffer.

This embodiment provides the advantage that no waiting times (for waiting for the auxiliary parity portion, if the decoding was erroneous based on the basic codeword portion) occur, which is particularly important for reducing zapping times or for mobile receivers. Hence, this embodiment also provides the advantage that no interruption of the service occurs (due to waiting for reception of auxiliary codeword portions) in case of (e.g. sudden) bad reception conditions of the basic codeword portions.

The present invention thus provides an effective and easily implementable measure for improving the reliability of decoding, particularly for mobile receivers in a broadcasting system, without any feedback from a receiver to the transmitter. If the DVB-T2 framing structure is kept unchanged and the FEFs contain the additional redundancy, i.e. the auxiliary codeword portion, there are basically two aspects that make a (mobile) receiver, or generally any receiver exploiting the present invention, more robust for mobile reception: i) The incremental redundancy as described and ii) the FEFs themselves with the embedded incremental redundancy, which can (and typically will) select transmission (e.g. OFDM) parameters that have a better behaviour in mobile channels. The most important ones are lower FFT sizes and higher pilot pattern densities (being related to the FFT and guard interval sizes). Of course the incremental redundancy data in the FEFs can additionally be protected by using lower modulation schemes, other interleaving depths etc.

The time interleaver depth chosen in the FEFs could, for example, complement the time interleaver depth of the T2 frames. If the T2 frame time interleaver fails (e.g. signal interrupted for a dedicated time (e.g. due to a tunnel etc.)), the other settings in the FEF time interleaver might be better suited and allow overall correct decoding. Different time interleaver settings of the T2 frame and the FEF frame overall improve the system performance.

The receiver in accordance with the present invention benefits therefore from the fact that in addition to the basic T2 reception the data in the FEFs (i.e. additional incremental redundancy) is more robust in mobile channels. Another main advantage of preferred embodiments of the present invention is that broadcasters do not have to transmit the data for mobile, (e.g. NGH) receivers, but only incremental redundancy is transmitted to enable a more robust reception of T2 data even with a mobile receiver. Thus, transmission bandwidth is utilized most efficiently.

The invention has been illustrated and described in detail in the drawings and foregoing description, but such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A receiver for receiving data, comprising:
circuitry configured to:
  receive a receiver input data stream segmented into frames, including a first frame and a second frame;
  extract a basic codeword portion of a codeword from the first frame and extract an auxiliary codeword portion of the codeword from the second frame, the basic codeword portion being generated from one or more input data words according to a first coding scheme, and the auxiliary codeword portion being generated from the one or more input data words according to a second coding scheme;
  buffer the auxiliary codeword portion;
  perform a first error correction process on the basic codeword portion according to at least the first coding scheme to generate one or more output data words of at least one output data stream that correspond to the one or more input data words;
  when a result of the first error correction process is erroneous, perform a second error correction process on the basic codeword portion and the auxiliary codeword portion according to at least the second coding scheme to generate the one or more output data words; and
  output the at least one output data stream that includes the one or more output data words; wherein the first frame includes one or more first preamble symbols followed by one or more first data symbols, and the second frame includes one or more second preamble symbols followed by one or more second data symbols.

2. The receiver as claimed in claim 1, wherein the second frame is transmitted before the first frame.

3. The receiver as claimed in claim 1, wherein
the first frame includes a baseband frame portion, and
the baseband frame portion of the first frame includes a data portion generated based on the one or more input data words and a padding portion configured to carry include signaling information.

4. The receiver as claimed in claim 1, wherein
the first coding scheme includes at least a BCH coding, and
the second coding scheme includes at least an LDPC coding scheme.

5. A method for receiving data, comprising:
receiving an input data stream segmented into frames, including a first frame and a second frame;
extracting, by circuitry of a receiving device, a basic codeword portion of a codeword from the first frame and extracting, by the circuitry of the receiving device, an auxiliary codeword portion of the codeword from the second frame, the basic codeword portion being generated from one or more input data words according to a first coding scheme, and the auxiliary codeword portion being generated from the one or more input data words according to a second coding scheme;

buffering the auxiliary codeword portion;

performing a first error correction process on the basic codeword portion according to at least the first coding scheme to generate one or more output data words of at least one output data stream that correspond to the one or more input data words;

when a result of the first error correction process is erroneous, performing a second error correction process on the basic codeword portion and the auxiliary codeword portion according to at least the second coding scheme to generate the one or more output data words; and outputting the at least one output data stream that includes the one or more output data words; wherein the first frame includes one or more first preamble symbols followed by one or more first data symbols, and the second frame includes one or more second preamble symbols followed by one or more second data symbols.

6. The method as claimed in claim 5, wherein the second frame is transmitted before the first frame.

7. The method as claimed in claim 5, wherein the first frame includes a baseband frame portion, and the baseband frame portion of the first frame includes a data portion generated based on the one or more input data words and a padding portion configured to carry signaling information.

8. The method as claimed in claim 5, wherein the first coding scheme includes at least a BCH coding, and the second coding scheme includes at least an LDPC coding scheme.

* * * * *